(12) United States Patent
Odajima et al.

(10) Patent No.: US 6,297,075 B1
(45) Date of Patent: Oct. 2, 2001

(54) METHOD AND APPARATUS FOR SEPARATING SEMICONDUCTOR ELEMENTS, AND MOUNTING METHOD OF SEMICONDUCTOR ELEMENTS

(75) Inventors: Hitoshi Odajima; Kazuyuki Futagi, both of Yokohama; Makoto Matsuoka, Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/516,504

(22) Filed: Mar. 1, 2000

(30) Foreign Application Priority Data

Mar. 3, 1999 (JP) .................................................. 11-056080
Sep. 6, 1999 (JP) .................................................. 11-251248

(51) Int. Cl.[7] .......................... H01L 21/44; H01L 21/48; H01L 21/50
(52) U.S. Cl. ......................... 438/110; 438/118; 438/460; 438/464
(58) Field of Search .................................... 438/106, 118, 438/110, 460, 464

(56) References Cited

U.S. PATENT DOCUMENTS 5,759,873 * 6/1998 Kata et al. .

* cited by examiner

*Primary Examiner*—Kevin M. Picardat
*Assistant Examiner*—D. M. Collins
(74) *Attorney, Agent, or Firm*—Antonelli, Terry, Stout & Kraus, LLP

(57) ABSTRACT

For providing a method and an apparatus thereof, wherein a thin semiconductor wafer is cut out into a unit of a thin semiconductor element under the condition of being stuck on an adhesive sheet, a group of the semiconductor elements are removed from the adhesive sheet at high speed without injuring and breaking each semiconductor element thereof, and the semiconductor elements are picked up from the removed group of the semiconductor elements by a predetermined unit, according to the present invention, the separating method comprising: a separation step for holding on a chuck a group of semiconductor elements with positioning objects, being stuck on an adhesive sheet fixed on a frame at periphery thereof under condition of a semiconductor wafer and cut into a unit of a semiconductor element, for cutting the adhesive sheet around the group of semiconductor elements being held, and for striping the cut adhesive sheet from said group of semiconductor elements being held; and a storing step for storing into a tray, for picking up the semiconductor elements by a desired unit thereof from the group of semiconductor elements being stripped with the adhesive sheet in said separation step and held on the chuck, so as to store into a tray.

7 Claims, 29 Drawing Sheets

UV IRRADIATION

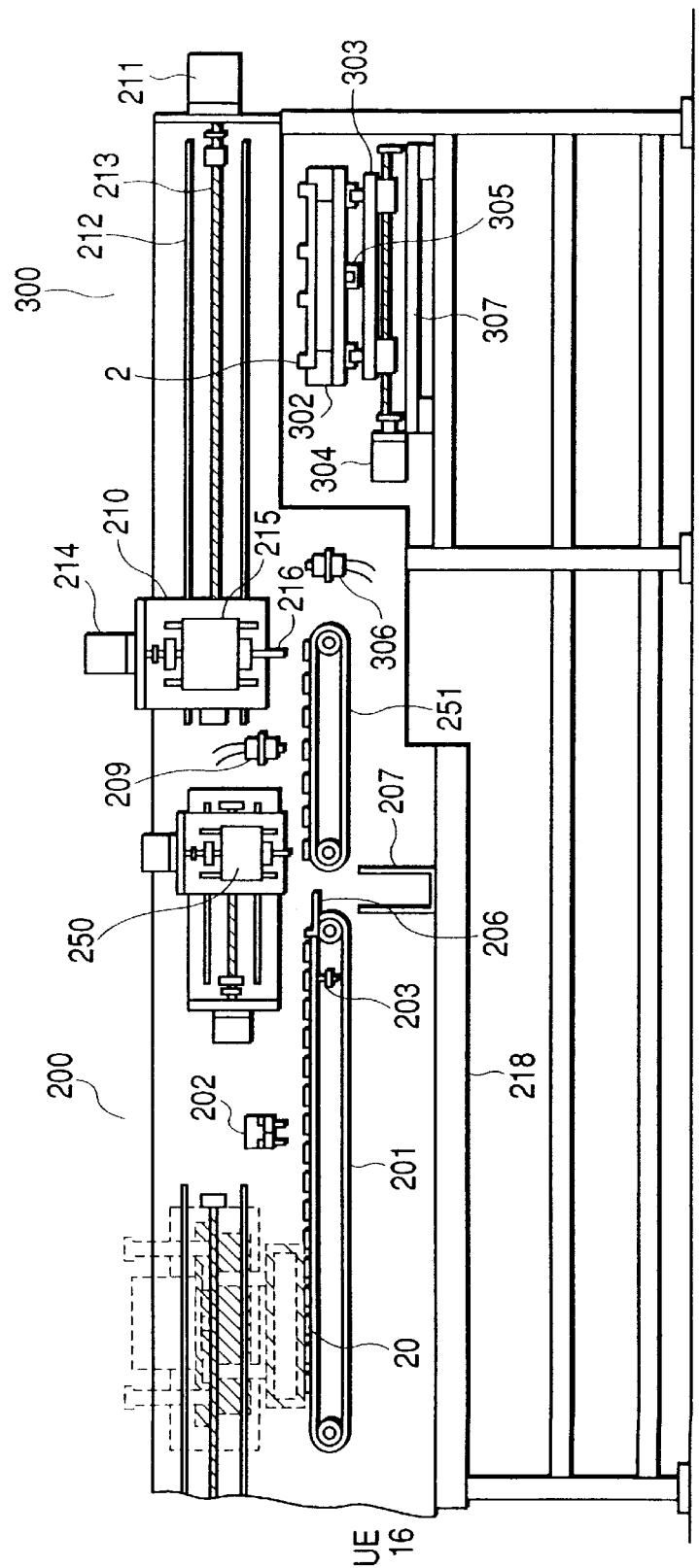

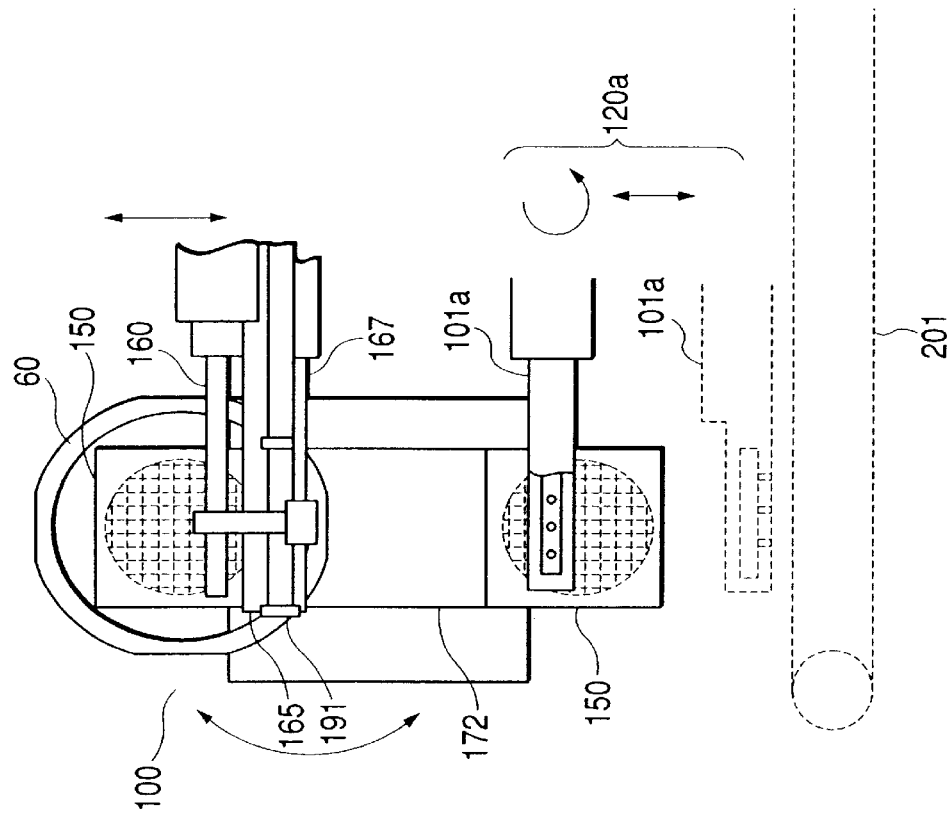
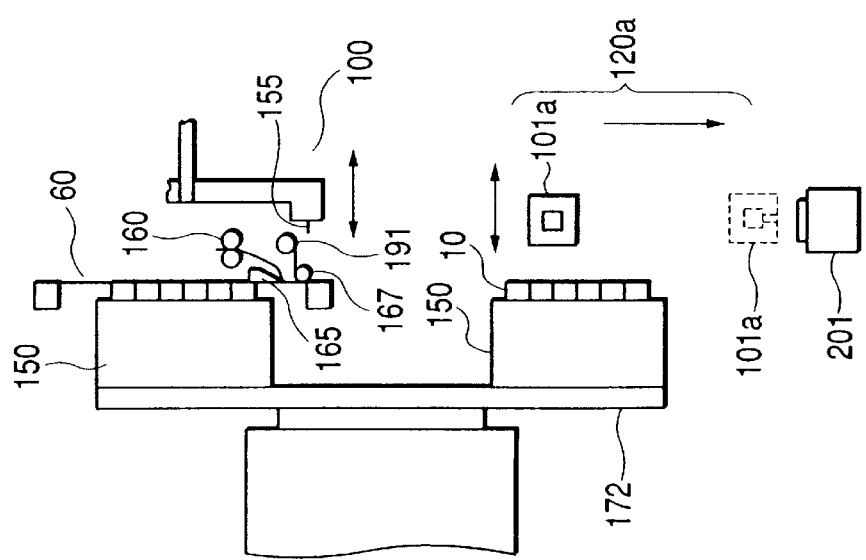

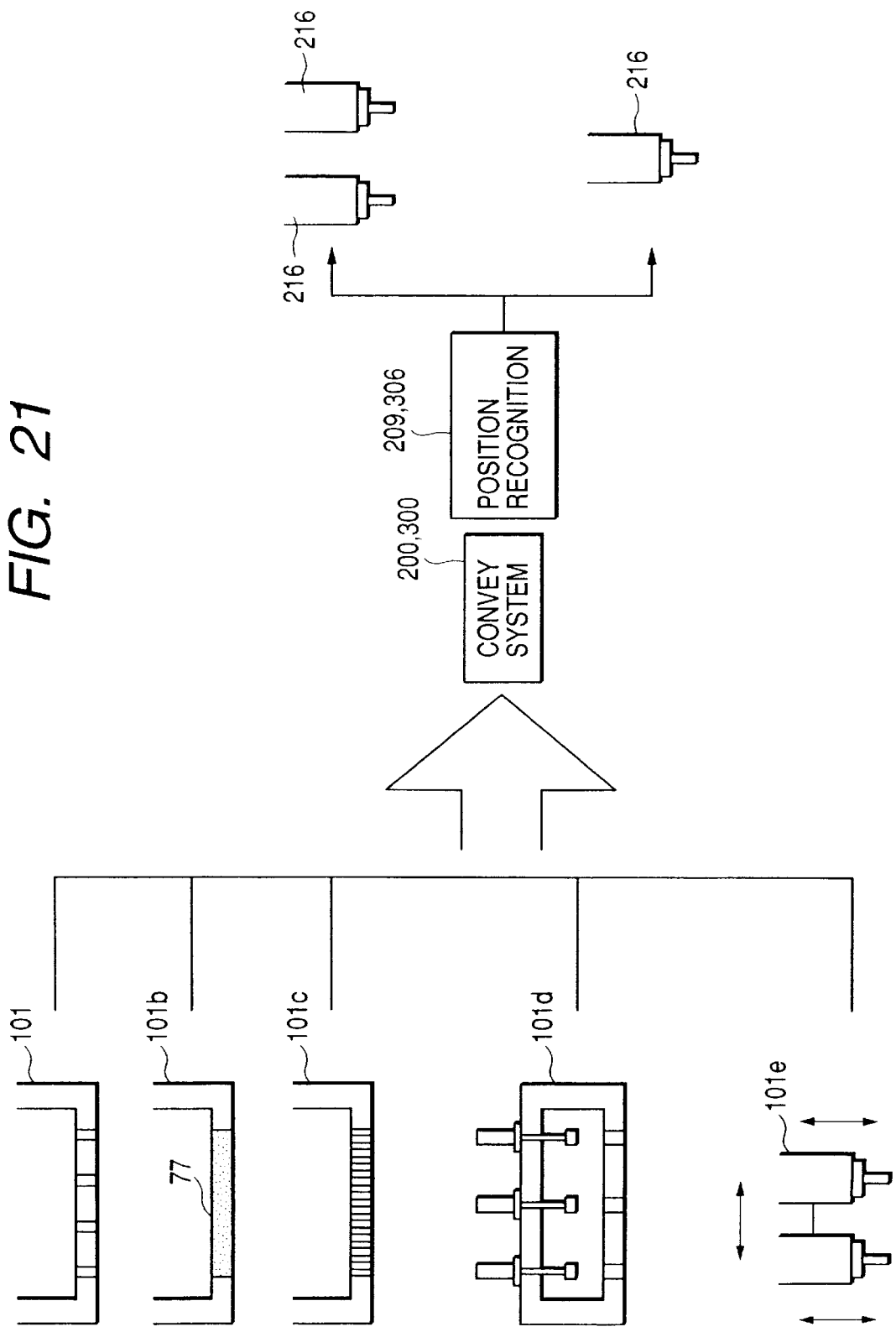

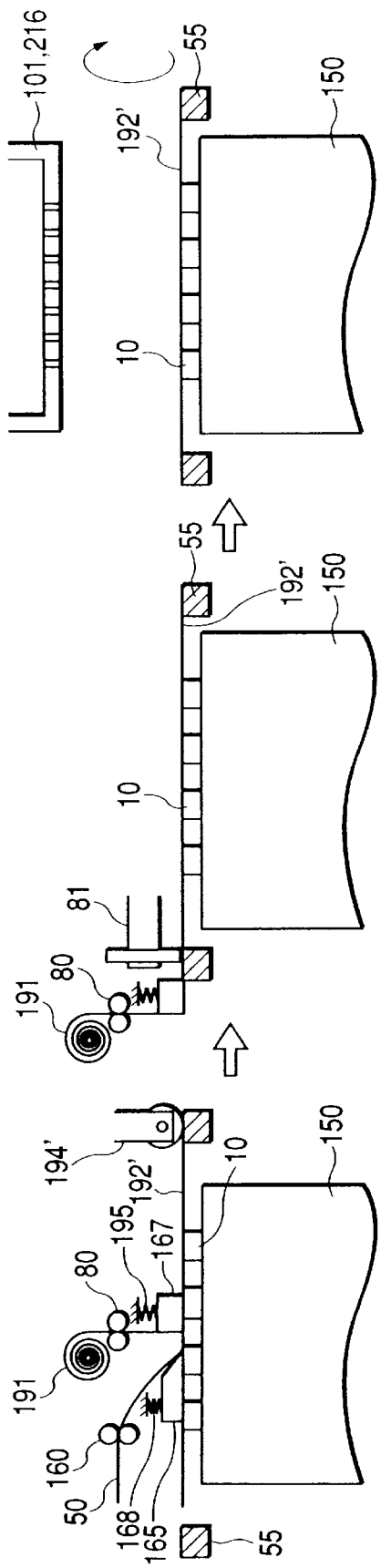

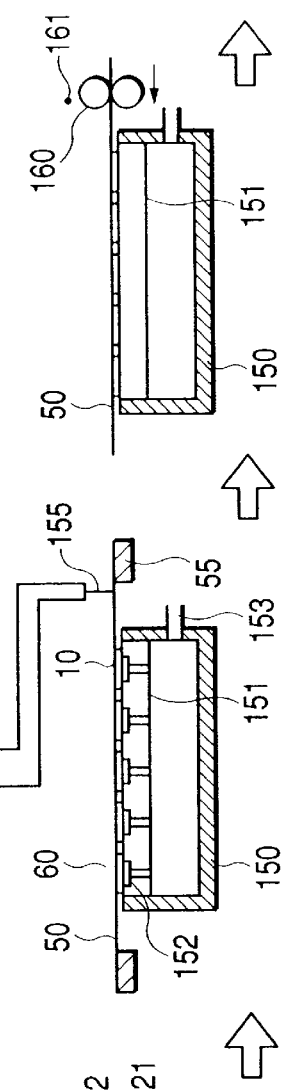
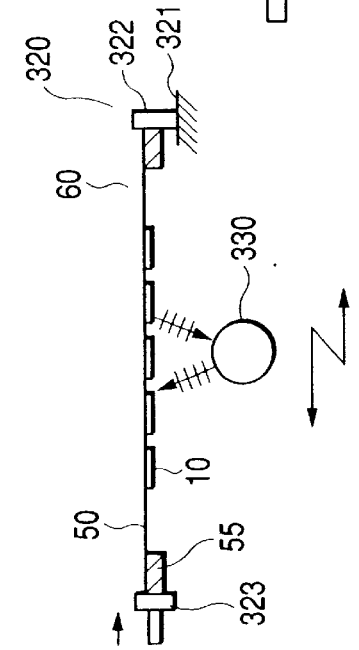
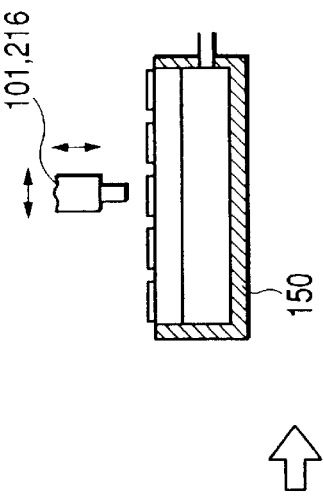
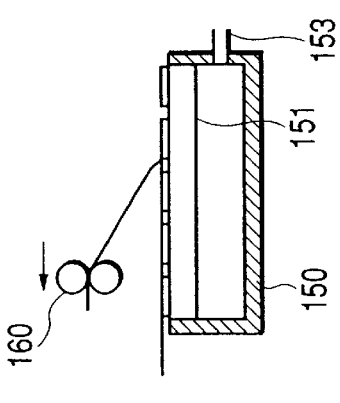
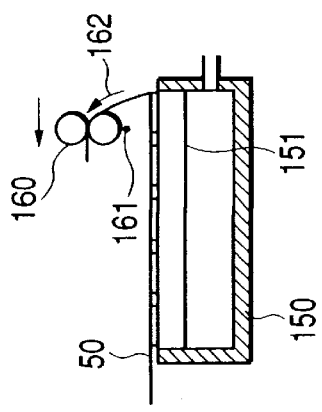

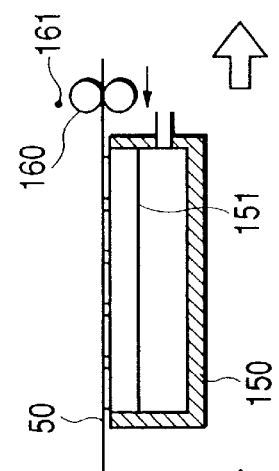
FIG. 34(a)
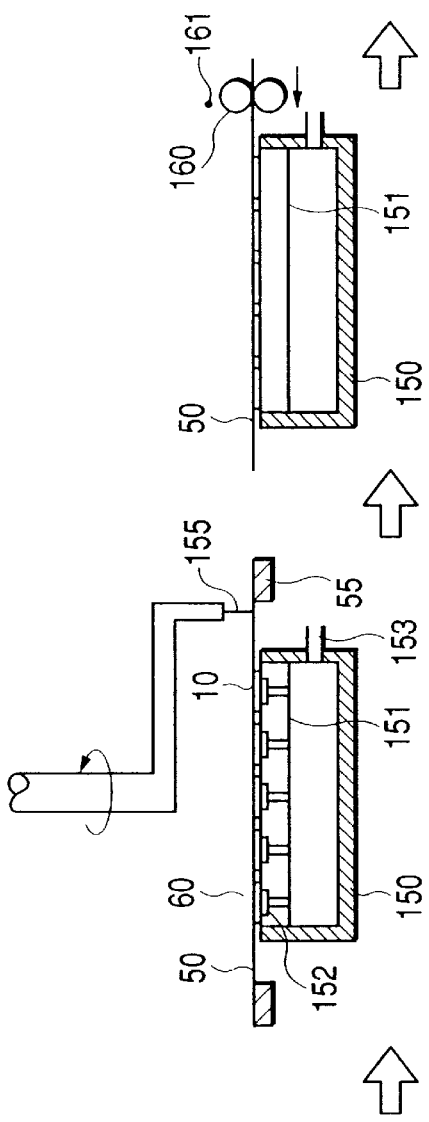
FIG. 34(b)
FIG. 34(c)
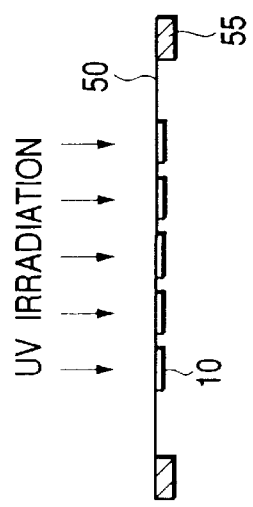
FIG. 34(d)
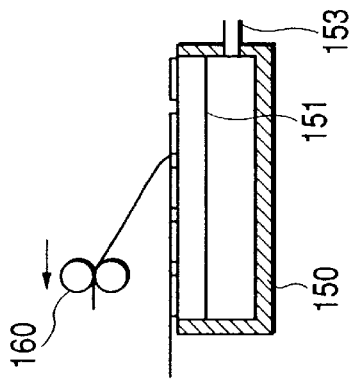
FIG. 34(e)

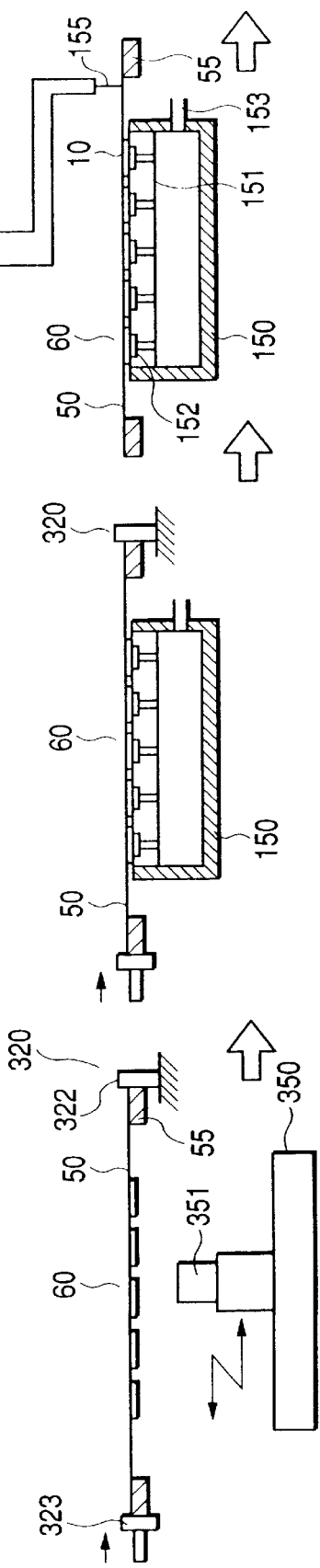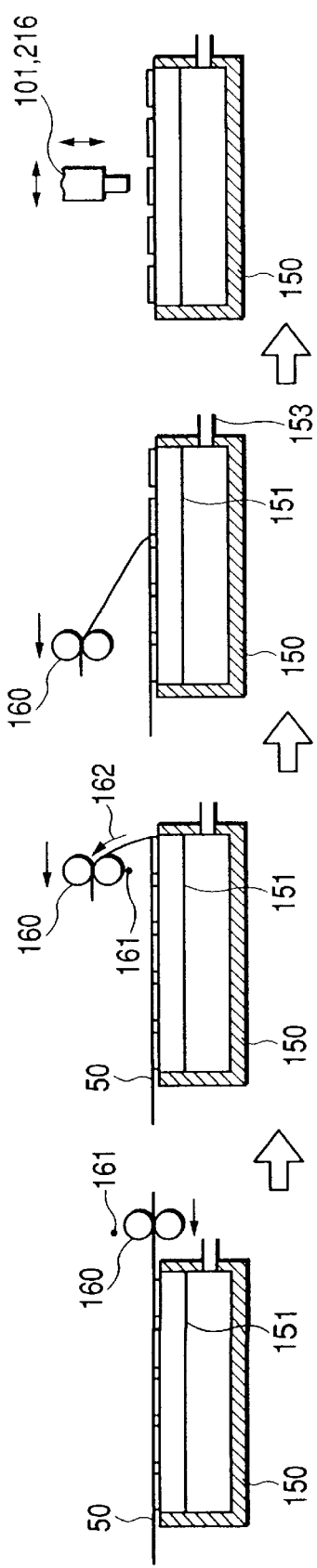

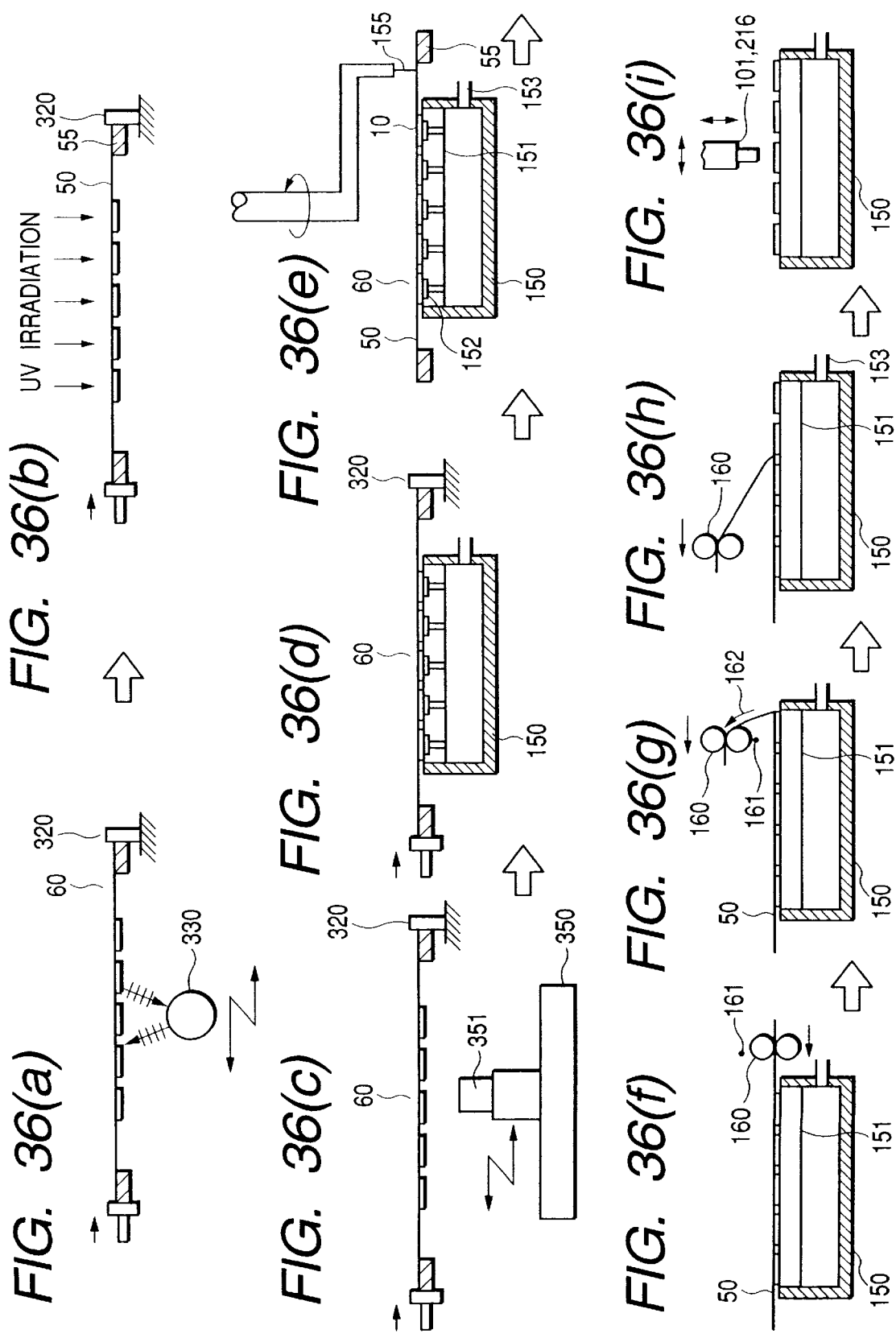

METHOD AND APPARATUS FOR SEPARATING SEMICONDUCTOR ELEMENTS, AND MOUNTING METHOD OF SEMICONDUCTOR ELEMENTS

BACKGROUND OF THE INVENTION

The present invention relates to a mounting method of semiconductor elements, a separation method and an apparatus of semiconductor elements, and further a manufacturing method of an IC card, in which the semiconductor elements are cut out into a unit of an electronic element (i.e., a semiconductor chip) from a condition of a semiconductor wafer or a condition of electronic parts being connected together in series, and the semiconductor element or electronic part cut or separated is picked up so as to be mounted on a tray or a board to be mounted, such as a circuit board or the like.

For example, a conventional technology is known in Japanese Patent Laying-Open No. Hei 6-295930 (1994) (conventional art 1) and Japanese Patent Laying-Open No. Hei 6-97214 (1994) (conventional art 2), in which semiconductor element (i.e., a semiconductor chip) is cut out as a unit thereof under the condition where a semiconductor wafer is stuck on an adhesive sheet, and the cut out semiconductor elements are striped with or removed from the adhesive sheet to be picked up.

In the conventional art 1, there is described that bonding force or power between the adhesive sheet and the semiconductor chip(s) is weaken by rubbing the reverse surface of the adhesive sheet, on which the semiconductor chips to be removed are attached, by means of a movable pin(s), while the semiconductor chip is lifted up, equally, with elevating thrust pins provided around the movable pin(s) together therewith, thereby separating or removing the semiconductor chip(s) from the adhesive sheet, the bonding force of which is weaken.

And, in the conventional art 2, while an adhesive sheet on which a large number of pellets are fixedly held, with directing the pellets below, sphere-like surfaces for pushing the adhesive sheet are formed at the lower ends of a needle unit, then the pellet is separated from the adhesive sheet by pushing down sharpened needles from the tips of the needle unit, thereby to be absorbed through vacuum by a collet(s) located below.

On a while, in Japanese Patent Laying-Open No. Hei 1-264236 (1989) (conventional art 3) is known a conventional technology for cutting the semiconductor wafer into a unit of the semiconductor element (i.e., the semiconductor chips) under the condition where the wafer is stuck on the adhesive sheet. In more detail, this conventional art 3 described a wafer break technology for severing the semiconductor elements under the condition of a wafer into the element units, by moving a roller having a bulge at a center thereof, while pushing the adhesive sheet attached onto a frame ring and the wafer treated with semi-full cutting and fixed on the adhesive sheet, from the reverse surface thereof.

On a while, for example for the semiconductor chip to be installed into an IC card or the like, a requirement of thinning in the thickness thereof is made from a necessity of thin-sizing of the end product, such as the IC card or the like. In this manner, when manufacturing the product, such as the IC card, by mounting such the thin semiconductor chip onto a circuit board (a board to be mounted) constructing the product, it must be performed without injuring nor breaking of the thin semiconductor chip(s).

However, in the conventional art 1 mentioned above, since the semiconductor chip is separated from the adhesive sheet by lifting up the semiconductor chip, equally, while elevating the movable pin together with the thrust pins provided around the movable pin, therefore the area for separation is small with respect to that of the adhesive surface on the semiconductor chip, in particular, in a case of the thin semiconductor chip, there is high possibility that the thin semiconductor chip cannot be separated but is rather broken or injured.

Also, in the conventional art 2, since the pellet is separated from the adhesive sheet by pushing down the needle sharpened at the tip, in particular, in a case of the thin semiconductor chip, there is high possibility that the thin semiconductor chip cannot be separated but is rather broken or injured therefrom.

And, the conventional art 3 relates to the wafer break technology for cutting out the semiconductor elements under the condition of the wafer into an element unit thereof.

In this manner, any one of those conventional arts mentioned above does not pay consideration onto the aspects, i.e., cutting the thin semiconductor wafer into a unit of the thin semiconductor element (i.e., the semiconductor chip) under the condition of being attached onto the adhesive sheet, and separating a group of the thin semiconductor elements being cut out in a condition of lines from the adhesive sheet, by means of the absorption collet, with removing them from the adhesive sheet at high speed, without injuring and breaking each semiconductor element thereof.

SUMMARY OF THE INVENTION

According to the present invention, for dissolving the problems mentioned above, an object is to provide a method for separating semiconductor elements and an apparatus thereof, wherein a thin semiconductor wafer is cut out into a unit of the thin semiconductor element (i.e., the semiconductor chip) under the condition of being attached or adhered onto the adhesive sheet, a group of the semiconductor elements are removed from the adhesive sheet at high speed without injuring and breaking each semiconductor element thereof, and the semiconductor element is picked up from the removed group of the semiconductor elements, thereby to be separate as the semiconductor element.

According to the present invention, another object is to provide a method for separating semiconductor elements and an apparatus thereof, wherein the thin semiconductor wafer is cut out into a unit of the thin semiconductor element (i.e., the semiconductor chip) under the condition of being attached or adhered onto the adhesive sheet, a group of the semiconductor elements are removed from the adhesive sheet at high speed without injuring and breaking each semiconductor element thereof, and the semiconductor element is picked up from the removed group of the semiconductor elements, thereby to be stored or packed in a tray.

According to the present invention, an other object is to provide a method for mounting semiconductor elements, wherein the thin semiconductor wafer is cut out into a unit of the thin semiconductor element (i.e., the semiconductor chip) under the condition of being attached or adhered onto the adhesive sheet, a group of the semiconductor elements are removed from the adhesive sheet at high speed without injuring and breaking each semiconductor element thereof, and the semiconductor element is picked up from the removed group of the semiconductor elements, thereby to be mounted onto a board to be mounted, such as on a tray, on a circuit board, etc.

Moreover, according to the present invention, a further other object is to provide a method for manufacturing an IC card, with which a thin type IC card of high quality can be manufacture cheaply, with good efficiency.

For achieving the above-mentioned object according to the present invention, there is provided a separating method of semiconductor elements comprising: a separation step for holding on a chuck a group of semiconductor elements as an object, being stuck onto an adhesive sheet under a condition of a semiconductor wafer and cut out into a unit of the semiconductor element, and striping said adhesive sheet from the group of semiconductor elements; and a storing step into a tray, for picking up the semiconductor elements by a desired unit thereof from the group of semiconductor elements being stripped with the adhesive sheet therefrom in said stripping step and being held on the chuck, so as to be stores into a tray.

Also, according to the present invention, there is provided a separating method of semiconductor elements comprising: a separation step for holding on a chuck a group of semiconductor elements, by positioning an object being stuck on an adhesive sheet which is fixed on a frame at periphery thereof, under condition of a semiconductor wafer and being cut into a unit of a semiconductor element, for cutting the adhesive sheet around the group of semiconductor elements being held, and for striping the cut adhesive sheet from said group of semiconductor elements being held; and a storing step for storing into a tray, for picking up the semiconductor elements by a desired unit thereof from the group of semiconductor elements being stripped with the adhesive sheet in said separation step and held on the chuck, so as to be stored into a tray.

Further, according to the present invention, there is provided a separating method of semiconductor elements comprising: a separation step for holding on a chuck a group of semiconductor elements as an object, being stuck onto an adhesive sheet under a condition of a semiconductor wafer and cut out into a unit of the semiconductor element, and for striping said adhesive sheet from the group of semiconductor elements; and a pickup step for picking up the semiconductor element independently from the group of semiconductor elements being stripped with the adhesive sheet therefrom in said separating step and being held on the chuck.

Further, according to the present invention, there is provided a separating method of semiconductor elements comprising: a separation step for holding on a chuck a group of semiconductor elements, by positioning an object being stuck on an adhesive sheet which is fixed on a frame at periphery thereof, under condition of a semiconductor wafer and being cut out into a unit of a semiconductor element, for cutting the adhesive sheet around the group of semiconductor elements being held, and for striping the cut adhesive sheet from said group of semiconductor elements being held; and a pickup step of picking up the semiconductor element independently from the group of semiconductor elements being stripped with the adhesive sheet therefrom in said separating step and being held on the chuck.

Further, according to the present invention, there is provided a separating method of semiconductor elements defined in the above, wherein said separation step and said pickup step are conducted in parallel to each other.

Further, according to the present invention, there is provided a separating method of semiconductor elements, comprising the following steps: holding a group of semiconductor elements, being adhered onto a sheet for use of provisional fixation thereof, which is held on a chuck and has adhesiveness, by positioning an object, being stuck onto an adhesive sheet which is fixed on a frame at periphery thereof under condition of a semiconductor wafer, and cut out into a unit of the semiconductor element; cutting the adhesive sheet around the semiconductor elements being held; and stripping the adhesive sheet cut from the group of semiconductor elements, thereby obtaining the group of semiconductor elements, each semiconductor element being adhered on the sheet for use of provisional fixation thereof, so as to be picked up.

Further, according to the present invention, there is provided a separating method of semiconductor elements, comprising the following steps: holding a group of semiconductor elements onto a chuck by positioning an object, being stuck onto an adhesive sheet which is fixed on a frame at periphery thereof under condition of a semiconductor wafer and cut out into a unit of the semiconductor element; cutting the adhesive sheet around the semiconductor elements being held; and adhering a sheet having adhesiveness for use of provisional fixation to the group of semiconductor elements on a side upon which said adhesive sheet is adhered so that each the semiconductor element can be picked up, while stripping the cut adhesive sheet from said group of semiconductor elements being held.

Further, according to the present invention, there is provided a separating apparatus of semiconductor elements comprising: a separation means having a chuck means for holding a group of semiconductor elements as an object, being stuck onto an adhesive sheet under a condition of a semiconductor wafer and cut into a unit of the semiconductor element, and a strip means for stripping said adhesive sheet from the group of semiconductor elements being held on said chuck; and a tray storing means for picking up the semiconductor elements by a desired unit thereof from the group of semiconductor elements, being stripped with the adhesive sheet by the strip means of said separation means and held on said chuck means.

Further, according to the present invention, there is provided a separating apparatus of semiconductor elements, comprising: a separation means having a chuck means for holding a group of semiconductor elements as objects, being stuck onto an adhesive sheet which is fixed on a frame at periphery thereof, under a condition of a semiconductor wafer and cut out into a unit of the semiconductor element, a cutting means for cutting the adhesive sheet around the group of semiconductor elements being held on said chuck means, and a strip means for stripping said adhesive sheet cut by said cutting means from the group of semiconductor elements being held on said chuck; and a tray storing means for picking up the semiconductor elements by a desired unit thereof from the group of semiconductor elements, being stripped with the adhesive sheet therefrom by the strip means of said separation means and being held on said chuck means.

Further, according to the present invention, there is provided a separating apparatus of semiconductor elements, comprising: a separation means, having a chuck means for holding a group of semiconductor elements as an object, being stuck onto an adhesive sheet under a condition of a semiconductor wafer and cut out into a unit of the semiconductor element, and a strip means for stripping said adhesive sheet from the group of semiconductor elements being held on said chuck; and a pickup means for picking up each of the semiconductor elements independently from the group of semiconductor elements, being stripped with the adhesive sheet therefrom by the strip means of said separation means and held on said chuck means.

Further, according to the present invention, there is provided a separating apparatus of semiconductor elements, comprising: a separation means, having a chuck means for holding a group of semiconductor elements as an object, being stuck onto an adhesive sheet which is fixed on a frame at periphery thereof, under a condition of a semiconductor wafer and cut out into a unit of the semiconductor element, a cutting means for cutting the adhesive sheet around the group of semiconductor elements being held on said chuck means, and a strip means for stripping said adhesive sheet being cut by said cutting means from the group of semiconductor elements being held on said chuck; and a pickup means for picking up each of the semiconductor elements independently from the group of semiconductor elements, being stripped with the adhesive sheet therefrom by the strip means of said separation means and held on said chuck means.

Further, according to the present invention, there is provided a separating apparatus of semiconductor elements, as defined in the above, wherein the chuck means is constructed rotatable so that the stripping of the adhesive sheet from the group of semiconductor elements by the separation means and the picking up of the semiconductor element by the pickup means can be conducted in parallel to each other.

Further, according to the present invention, there is provided a separating apparatus of semiconductor elements, as defined in any one of the above, further comprising an outer configuration detecting means for detecting an outer configuration of the group of semiconductor elements as the object, in the separation means of said separating apparatus.

Further, according to the present invention, there is provided a separating apparatus of semiconductor elements, as defined in any one of the above, further comprising a detection means for detecting an address in the group of the semiconductor elements of the object, upon basis of a condition where the group of the semiconductor elements as the object are held on the chuck means, in the separation means of said separating apparatus.

Further, according to the present invention, there is provided a separating apparatus of semiconductor elements, as defined in any one of the above, further comprising a removal means for removing dusts remained on a chuck surface of the chuck means after being picked up by the pickup means.

Further, according to the present invention, there is provided a separating apparatus of semiconductor elements, comprising: a chuck means for holding a sheet having adhesiveness for use of provisional fixation, upon which a group of semiconductor elements are adhered by positioning an object, being adhered on an adhesive sheet which is fixed on a frame at periphery thereof under a condition of a semiconductor wafer and cut out into a unit of the semiconductor element; a cutting means for cutting the adhesive sheet around the group of semiconductor elements, being held on said chuck means through the sheet for use of provisional fixation; and a separation means for obtaining the sheet for use of provisional fixation, being adhered with the group of semiconductor elements thereon so that each the semiconductor element can be picked up, by striping the adhesive sheet cut with said cutting means, from the group of semiconductor elements which are held on said chuck means through the sheet for use of provisional fixation.

Further, according to the present invention, there is provided a separating apparatus of semiconductor elements, comprising: a chuck means for holding a group of semiconductor elements by positioning an object, being adhered on an adhesive sheet which is fixed on a frame at periphery thereof, under a condition of a semiconductor wafer and cut out into a unit of the semiconductor element; a cutting means for cutting the adhesive sheet around the group of semiconductor elements being held on said chuck means; a separation means for striping the adhesive sheet cut by said cutting means from the group of semiconductor elements being held on said chuck means; and an adhere means for adhering a sheet having adhesiveness for use of provisional fixation, onto the group of semiconductor elements being stripped with the adhesive sheet therefrom by said separation means, on a side on which said adhesive sheet was adhered, so that each the semiconductor element can be picked up.

Further, according to the present invention, there is provided a separating apparatus of semiconductor elements, comprising: a chuck means for holding a group of semiconductor elements as an object, being adhered on an adhesive sheet which is fixed on a frame at periphery thereof, under a condition of a semiconductor wafer and cut out into a unit of the semiconductor element; a stretch mechanism for stretching the adhesive sheet into a predetermined direction with holding an end thereof, under a condition of holding the group of semiconductor elements on said chuck means; and a forming means for striping said adhesive sheet from the group of semiconductor elements by moving into a predetermined direction, while suppressing said adhesive sheet when stretching the adhesive sheet by said stretch mechanism.

Further, according to the present invention, there is provided a separating apparatus of semiconductor elements, as defined in the above, further comprising a pickup means for picking up each the semiconductor element independently from the group of semiconductor elements, being under a condition that the adhesive sheet is stripped therefrom.

Further, according to the present invention, there is provided a separating apparatus of semiconductor elements, as defined in the above, further comprising a means for lessening decrease in holding force applied to the group of semiconductors by the chuck means when stripping the adhesive sheet from the group of semiconductor elements.

Further, according to the present invention, there is provided aseparating apparatus of semiconductor elements, as defined in any one of the above, wherein the separation means is so constructed that the stretch means for stretching the adhesive sheet with holding the end thereof, and the forming mechanism for forming a bent configuration of the adhesive sheet while suppressing the adhesive sheet when stretching the adhesive sheet by said stretch means, are moved at least in a direction along with a surface of the adhesive sheet.

Further, according to the present invention, there is provided a mounting method of semiconductor elements comprising: a separation step for holding on a chuck a group of semiconductor elements as an object, being stuck onto an adhesive sheet under a condition of a semiconductor wafer and cut out into a unit of the semiconductor element, and for striping said adhesive sheet from the group of semiconductor elements; a convey step for carrying the semiconductor elements to a position to be mounted, by picking up the semiconductor element(s) from the group of semiconductor elements, being stripped the adhesive sheet therefrom and held on the chuck, by a desired unit thereof; and a mounting step for mounting the semiconductors carried in by said convey step into a tray or on a board to be mounted.

Further, according to the present invention, there is provided a mounting method of semiconductor elements comprising: a separation step for holding on a chuck a group of semiconductor elements, by positioning an object, being stuck on an adhesive sheet which is fixed on a frame at periphery thereof, under condition of a semiconductor wafer and cut out into a unit of a semiconductor element, for cutting the adhesive sheet around the group of semiconductor elements being held, and for striping the cut adhesive sheet from said group of semiconductor elements being held; a convey step for carrying the semiconductor elements to a position to be mounted, by picking up the semiconductor element(s) from the group of semiconductor elements, being stripped with the adhesive sheet therefrom and held on the chuck, by a desired unit thereof; and a mounting step for mounting the semiconductor carried in by said convey step in a tray or on a board to be mounted.

BRIEF DESCRIPTION OF THE DRAWING(S)

FIG. 1 shows an outline structure of an embodiment of an entire system, wherein a thin semiconductor chip is cut out by dicing from the condition of a thin semiconductor wafer, thereby to be mounted, according to the present invention;

FIGS. 2(a) to (c) are views for explaining a manufacturing method of works being supplied to a separation mechanism portion according to the present invention;

FIGS. 3(a) to (d) are views for explaining a principle of the separation mechanism portion for the thin semiconductor chips according to the present invention;

FIGS. 4(a) and 4(b) are views for showing a relationship between an angle ψ of acting direction of a tensile force F applied to sticking surface on the semiconductor chip and forces Fx and Fy applied to the semiconductor chip, when removing or stripping the adhesive sheet from a group of thin semiconductor chips, by means of the tensile force F acting upon the adhesive sheet, in the separation mechanism shown in the FIGS. 3(a) to (d);

FIGS. 5(a) and (b) are perspective views for showing a condition where the adhesive sheet is stripped or removed from the group of semiconductor chips with using a wedge-like jig for fixing strip angle, in the separation mechanism shown in the FIGS. 3(a) to (d);

FIG. 6 is an enlarged view for showing a condition where the adhesive sheet is stripped or removed from the semi-conductor ship by forming a bent potion in the adhesive sheet, with use of the wedge-like strip angle fixing jig;

FIGS. 7(a) to (d) are views for explaining an embodiment of the separation mechanism portion for stripping or removing the adhesive sheet from the group of semiconductor chips, with using the strip angle fixing jig according to the present invention;

FIG. 8 is a partial cross-section view of showing the separation mechanism portion shown in the FIGS. 7(a) to (d) from a side surface thereof;

FIGS. 9(a) to (c) are views for explaining configurations of various chucks in the separation mechanism portion;

FIGS. 10(a) and (b) are views for explaining a configurations of a chuck other than those shown in the FIGS. 9(a) to (c);

FIGS. 11(a) and (b) are views for showing a case where a porous absorption plate is applied to a absorption surface of the chuck;

FIGS. 12(a) to (d) are views for explaining an other embodiment of the separation mechanism portion for stripping or removing the adhesive sheet from the group of semiconductor chips, with using the strip angle fixing jig according to the present invention;

FIGS. 13(a) and (b) are views for explaining the configuration of a tape or the like, following the strip angle fixing jig shown in the FIGS. 12(a) to (d);

FIG. 17 is a structure view of showing a separation belt conveyer portion and a mounting mechanism portion in an embodiment of the entire system, wherein the thin semiconductor chip is cut out by dicing from the condition of a thin semiconductor wafer, thereby to be mounted, according to the present invention;

Figure 19A:
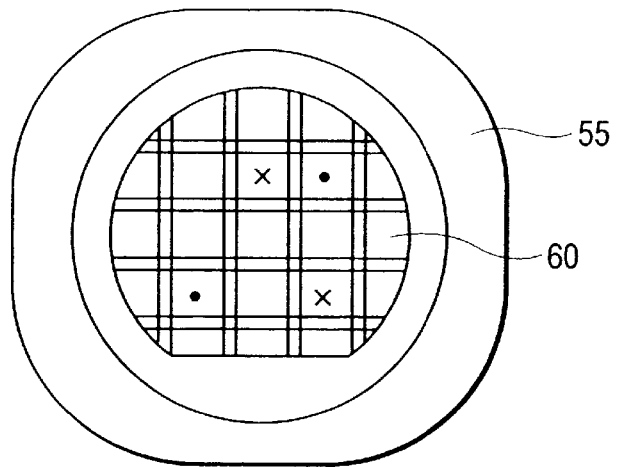
Figure 19B:
Figure 19C:
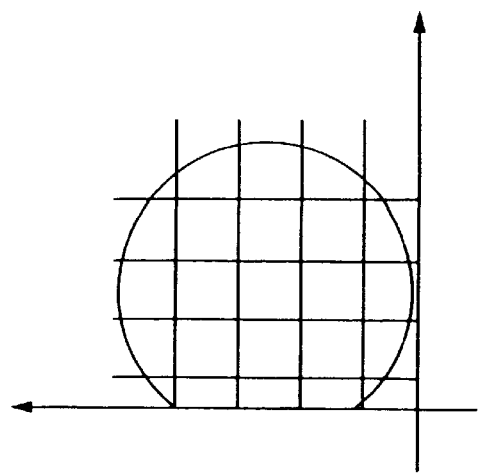
Figure 23:
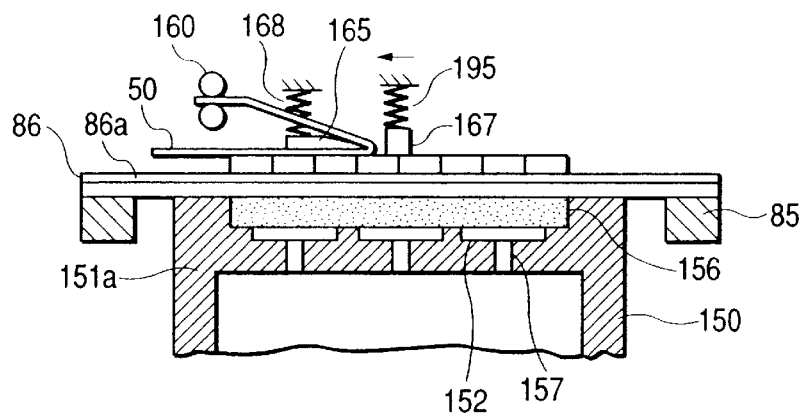
Figure 24:
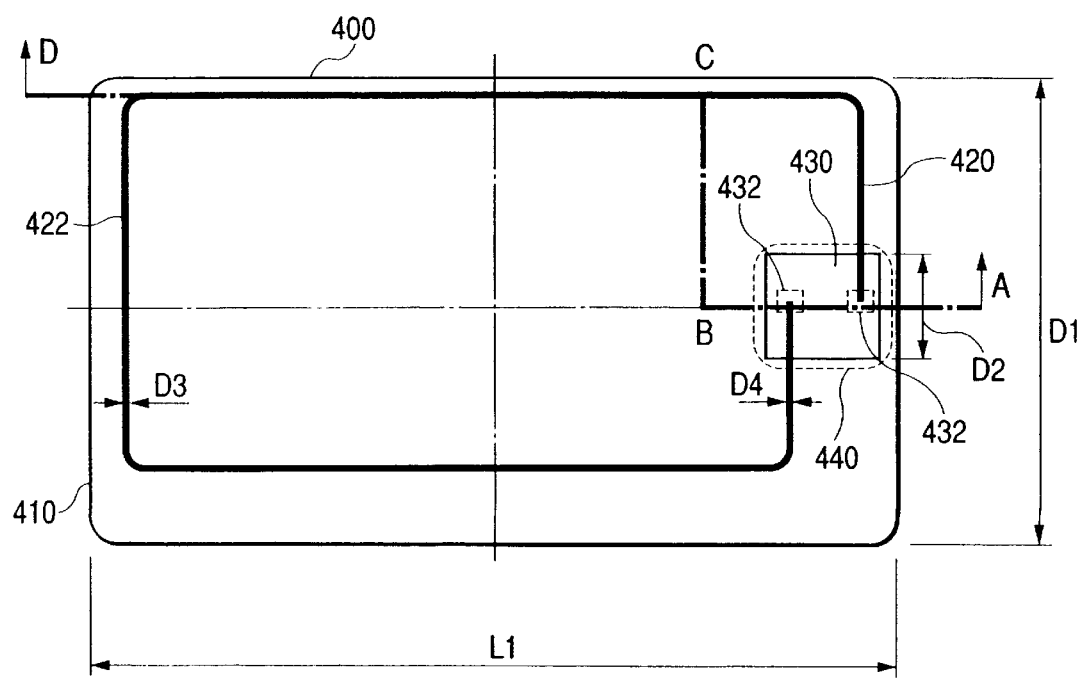
Figure 25:
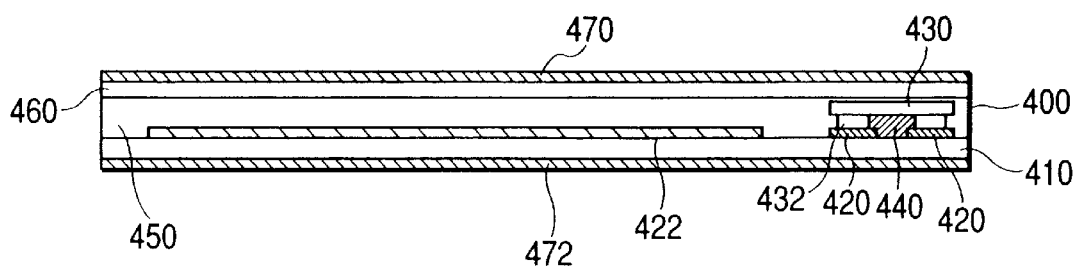
Figure 26:
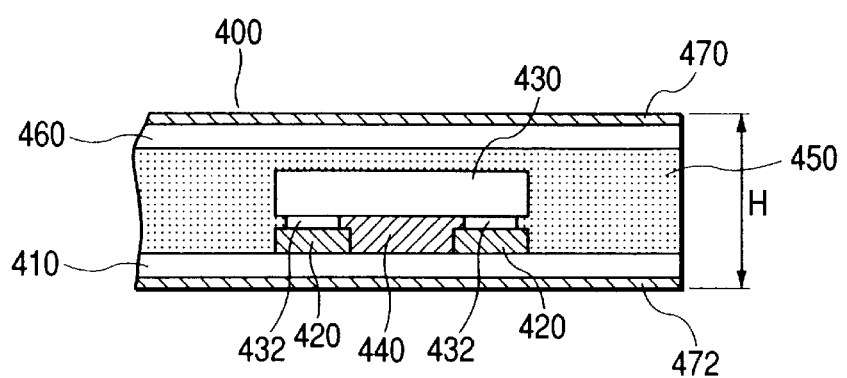
Figure 27:
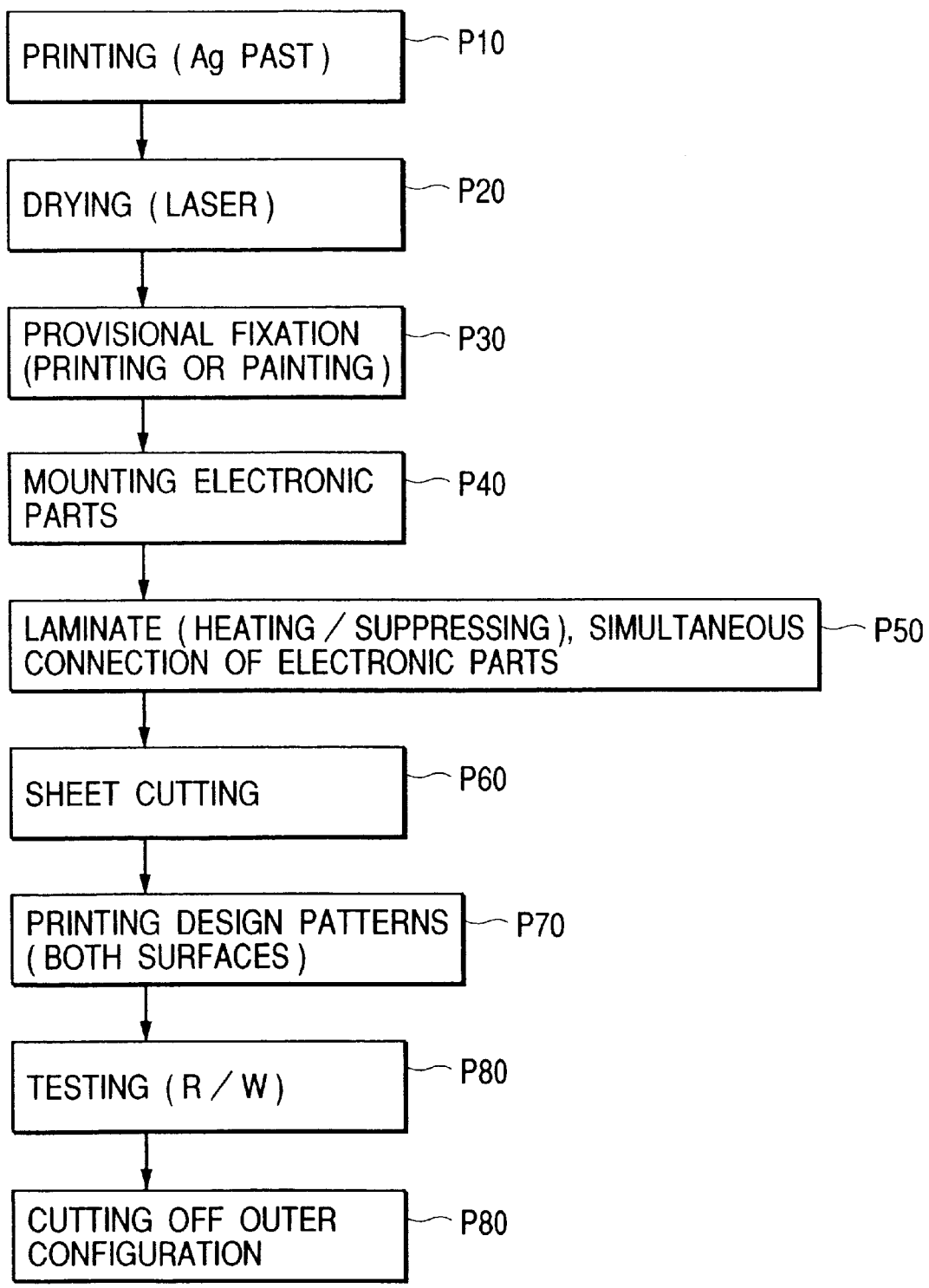
Figure 28:
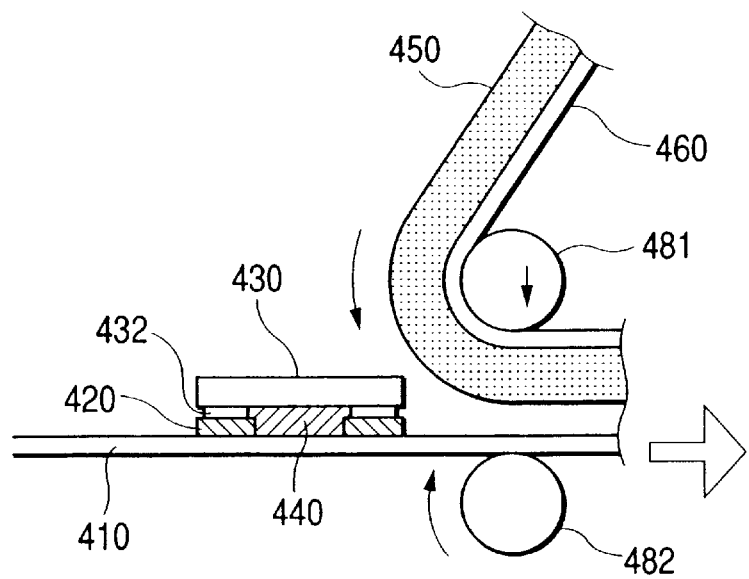
Figure 29:
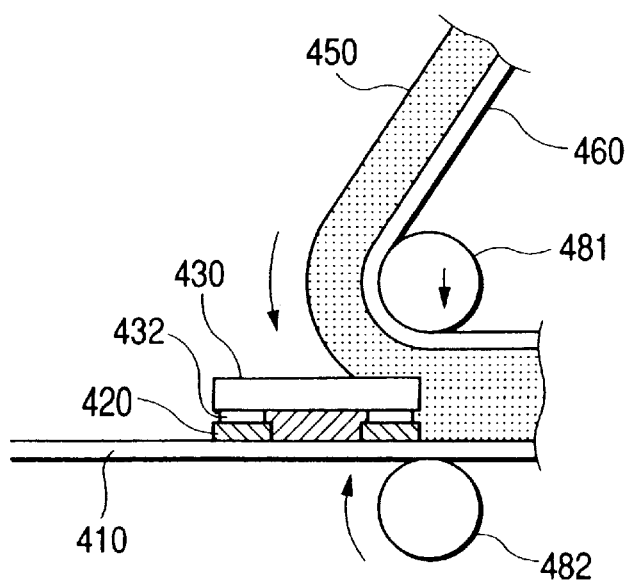
Figure 30:
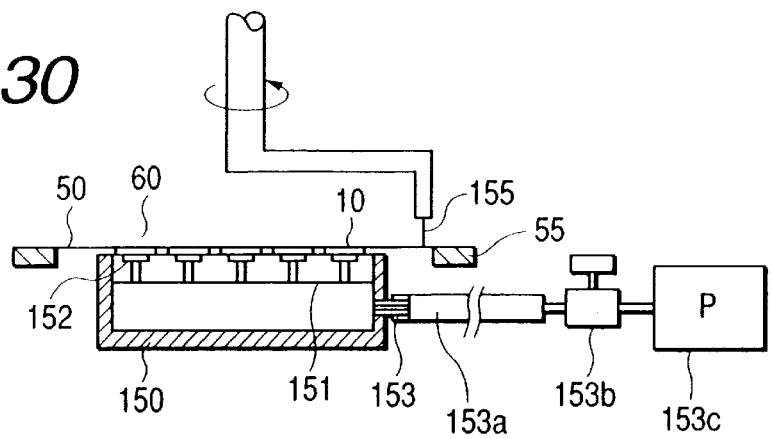
Figure 31:
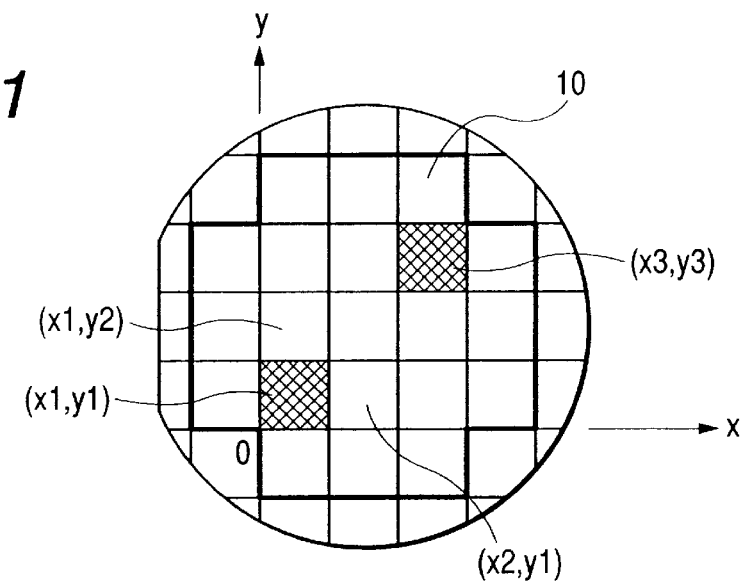
Figure 32:
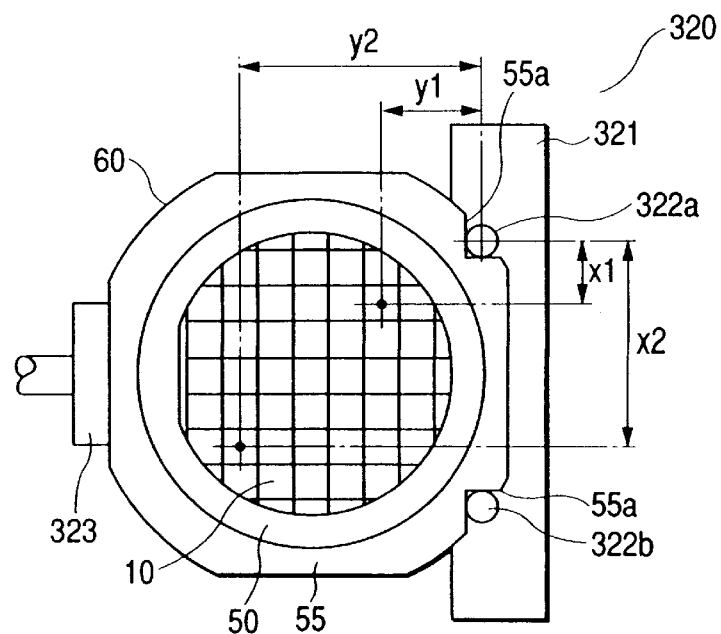
Figure 37:
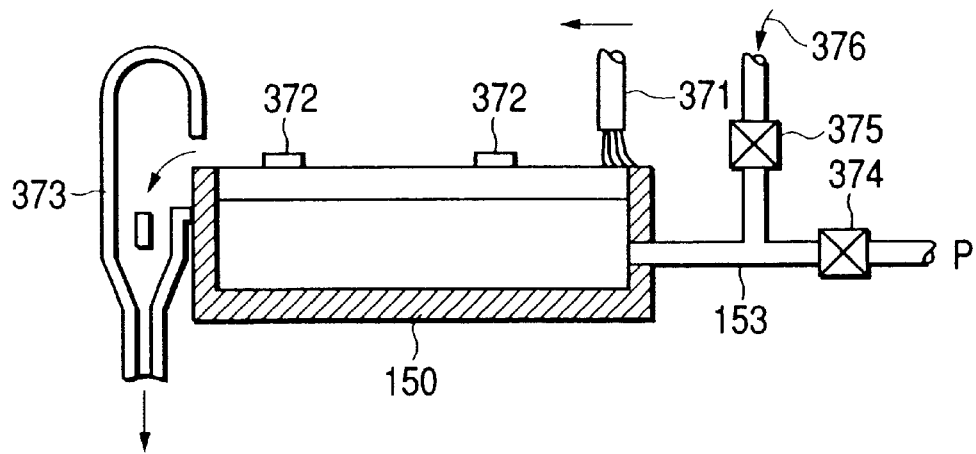
Figure 38:
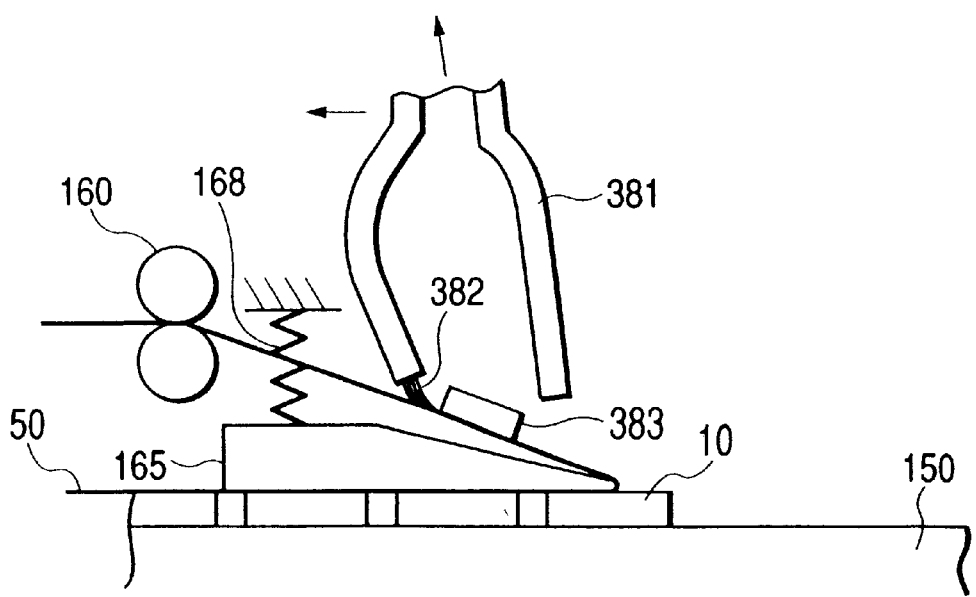

FIGS. 18(a) to (d) are views for explaining calculation of positions of electrodes formed on the semiconductor chip, standardizing upon an absorption nozzle as a reference on the semiconductor chip side, when being mounted on a board to be mounted;

FIGS. 19(a) to (c) are views for showing bad or non-quality semiconductor chip(s) on a coordinate system being provided on the semiconductor wafer as a work, in relation to the present invention;

FIGS. 20(a) and (b) are views for showing an outline structure of an embodiment, in a case where the separation mechanism portion according to the present invention is changed into a vertical type;

FIG. 21 is a view for showing a concept up to the mounting, in a case where the absorption collet is formed in various configures thereof;

FIGS. 22(a) to (c) are views for explaining an embodiment, in which an arrangement of the semiconductor chips is reversed on the chuck of the separation mechanism portion, but the same function of the tray also can be achieved therewith;

FIG. 23 is a view for explaining an other embodiment, in which the same function of the tray can also be achieved on the chuck of the separation mechanism portion therewith;

FIG. 24 is a plane view of showing an IC card according to the present invention;

FIG. 25 is a cross-section view of cutting surface A-B-C-D in the FIG. 24;

FIG. 26 is an enlarged cross-section view of a principle portion in the FIG. 25;

FIG. 27 a view for showing steps for manufacturing the IC card according to the present invention;

FIG. 28 is a view for explaining a step for laminating (heating/pressuring) and for connecting electronic parts simultaneously;

FIG. 29 is a view for explaining also the step for laminating (heating/pressuring) and for connecting electronic parts simultaneously;

FIG. 30 a structure view of showing an embodiment, in which chucking force of the chuck is made variable depending upon a kind (material) of the semiconductor chip, by changing vacuum pressure of a vacuum source freely;

FIG. 31 is a view for showing a group of semiconductor chips, being stuck on an adhesive sheet which is pasted (or mounted) on a metal frame, diagrammatically;

FIG. 32 is a view for showing a mechanism for determining positions for the group of semiconductor chips;

FIGS. 33(a) to (f) are views for showing a first embodiment under the principle of the separation mechanism portion shown in the FIG. 3(a) to (d);

FIGS. 34(a) to (e) are views for showing a second embodiment under the principle of the separation mechanism portion shown in the FIG. 3(a) to (d);

FIGS. 35(a) to (g) are views for showing a third embodiment under the principle of the separation mechanism portion shown in the FIG. 3(a) to (d);

FIGS. 36(a) to (i) are views for showing a fourth embodiment under the principle of the separation mechanism portion shown in the FIG. 3(a) to (d);

FIG. 37 is a view of an embodiment of a removal means for removing or brushing dusts, such as bad quality chip(s) and/or broken pieces or ends remained on the chuck; and FIG. 38 is a view of an embodiment, in which the dusts, such as the broken pieces or ends and alien substances are separated from the adhesive tape to be collected.

DETAILED DESCRIPTION OF PREFERRED EMBODIMENTS

Hereinafter, embodiments according to the present invention will be fully explained by referring to the attached drawings.

Figure 1:
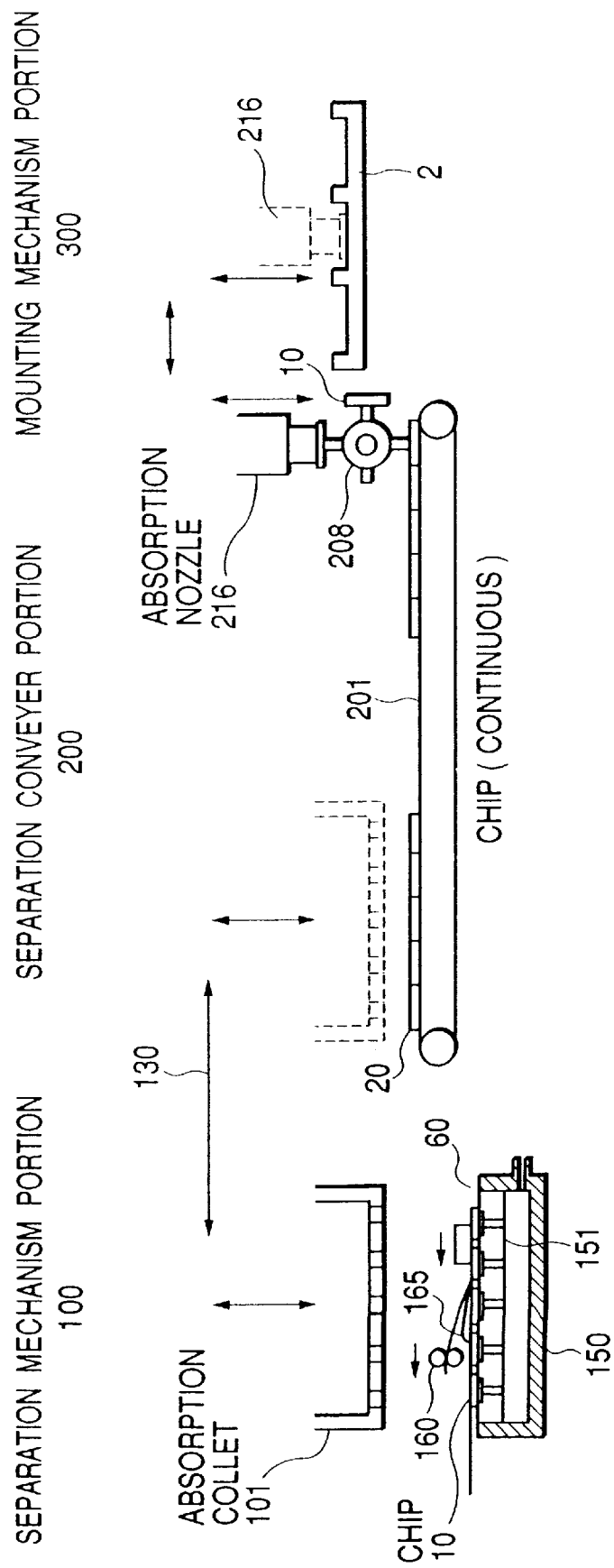

In the FIG. 1 is shown an outline structure of a first embodiment of an entire system for mounting onto a circuit board constructing an IC card or the like, according to the present invention, in which thin semiconductor chips (i.e., the semiconductor elements) are cut out from the condition of a thin semiconductor wafer (i.e., a semiconductor substrate) by dicing (i.e., cutting) to be mounted (or stored) on a tray, etc. This system comprises a separation mechanism portion 100 (i.e., a separation means) for separating the thin semiconductor chips (i.e., the semiconductor elements) having a thickness, being about from 0.002 mm to 0.2 mm, from the condition of thin semiconductor wafer (i.e., the semiconductor substrate) having a thickness, being about from 0.002 mm to 0.2 mm, through dicing (cutting) process, and for absorbing a group 20 of thin semiconductor chips (the semiconductor elements), being in a condition of line, onto an absorption collet 101 at one time; a separation conveyer portion (i.e., a convey means) for separating each the thin semiconductor chip (the semiconductor element) from the group 20 of thin semiconductor chips (the semiconductor elements) in the condition of a line(s), which are separated from the condition of the thin semiconductor wafer (the semiconductor substrate) in the said separation mechanism portion 100, to be reversed, and for absorbing the reversed thin semiconductor chip by an absorption nozzle 216; and a mounting mechanism portion (i.e. a tray packing portion) 300 for mounting the thin semiconductor chips 10 which are absorbed and conveyed, by the absorption nozzle 216 in the said conveyer portion 200, into a tray or the like to be packed therein. However, it can be applied to the semiconductor devices, such as chip-size packages, being lined up in a large number thereof on a substrate or connected by a tape, other than the semiconductor wafer.

Next, explanation will be given on a manufacturing method of works 60 which are supplied to be mounted on a stage 61 of the separation mechanism portion 100, by referring to the FIGS. 2(a) to (c).

The thin semiconductor wafer 40 is manufactured by building up semiconductor circuits on a material, such as of silicon, by a unit of the chip through a general semiconductor manufacturing method. The thin semiconductor wafer 40 on which the semiconductor circuits are build up in such the manner are selected into a quality pellet (i.e., good quality pellet) and a non-quality pellet (i.e., bad, poor or no-good quality pellet) which cannot be repaired nor restored, through testing on electric properties and/or checking on an external appearance thereof. The non-quality pellet is attached with a mark thereon, or the position coordinates thereof are stored into a recording medium or a memory device with making correspondence to a product number on or of the thin semiconductor wafer.

On the reverse surface of the thin semiconductor wafer 40 checked in this manner is stuck or attached an adhesive sheet 50 being larger than the external form thereof, in a step of sheet adhesion. The adhesive sheet 50 comprises a sheet material 51, which is formed in a thin film-like shape having a diameter larger than that of the wafer, from an elastic and/or flexible resin, such as PVC (polyvinyl chloride), PET (polyethylene terephthalate), etc. On one side surface of the sheet material 51 is formed an adhesive layer 52 by applying a predetermined adhesive agent. This adhesive agent is made of a material of polyimide group, and has a property to be harden and then reduced in the bonding force or power with irradiation of ultra-violet rays (UV) thereupon. As this adhesive agent also can be applied a material of acryl group having a property to be harden and then reduced in the bonding force or power by adding heat thereon. Of course, when using this adhesive agent, heat is added to in the place of the irradiation of ultra-violet rays (UV).

Figure 2A:
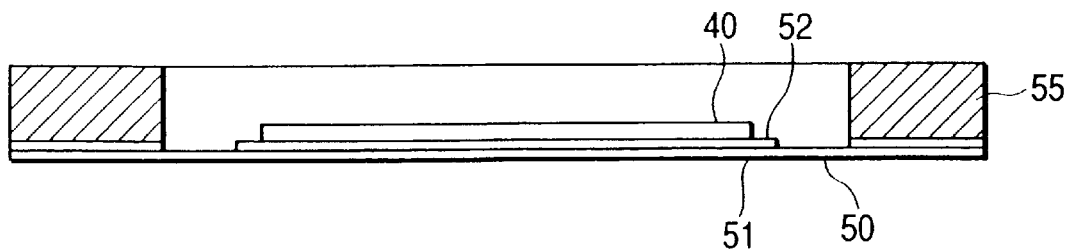

Next, in a step of attaching of jig, as shown in the FIG. 2(a), the adhesive sheet 50 sticking to the thin semiconductor wafer 40 thereon is expanded or stretched without slackening to be attached on a metal frame (i.e., a carrier ring) 55 of stainless steel or the like, thereby to be mounted thereon.

Figure 2B:
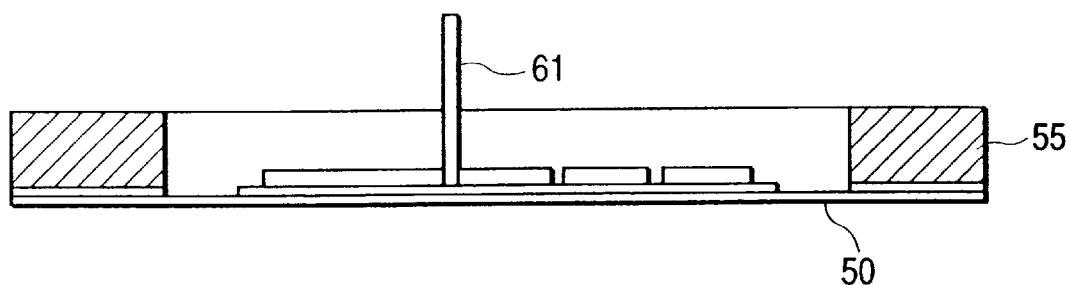

The thin semiconductor wafer 40 being stuck upon the adhesive sheet 50 which is mounted on the metal frame (the carrier ring) 55 is cut out into each the thin semiconductor chip by using a thin grind- or whetstone 61 in a step of dicing as shown in the FIG. 2(b). The thin semiconductor wafer 40 can be diced or cut out since the adhesive sheet 50 sticks it with the bonding force thereof, being enough to hold it during the time period for the dicing or cutting process. Further, the adhesive sheet 50 is not cut down with that dicing process, then the groups 20 of the cut semiconductor chips are in the condition of being adhered or stcuck onto the adhesive sheet 50 with the bonding force thereof.

Figure 2C:
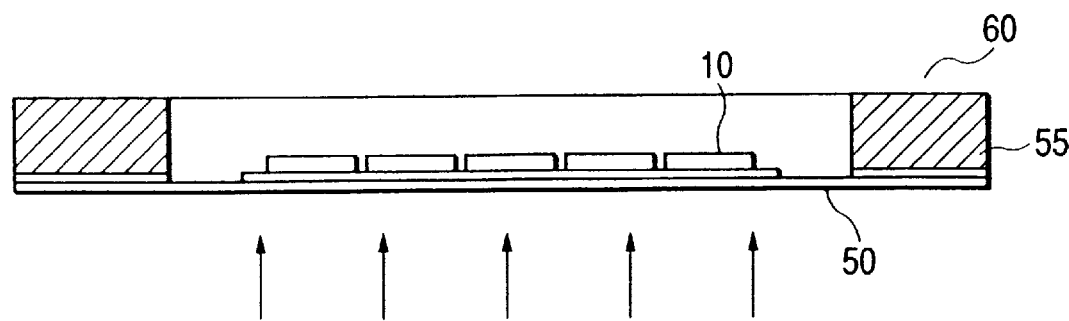

Next, as shown in the FIG. 2(c), the ultra-violet rays (UV) is irradiated upon an area where the semiconductor chips 10 are stuck or adhered on the adhesive sheet 50, so as to harden the adhesive 52 on the adhesive sheet 50, thereby reducing the bonding force thereof.

The work 60 manufactured in the manner mentioned above is supplied to the separation mechanism portion 100 to be mounted on a movable stage (i.e., conveyer means) 170, so as to be fixed thereon.

Next, a principle of the separation mechanism portion 100, according to the present invention, will be explained by referring to FIGS. 3 to 6.

First, the operation of the separation mechanism portion (i.e., separation means) 100 will be explained by referring to the FIGS. 3(a) to (d). As is shown in the FIG. 3(a), an entire portion of the surface, on which electrodes 11 of the semiconductor chip being cut with respect to the work 60 are formed, are held strongly by means of a chuck 150 for holding. The chuck 150, on the surface of which are formed gutters 152 for vacuum absorption corresponding to each the semiconductor chip 10, is constructed by comprising a chucking surface material 151 for connecting the each gutters 152 to a vacuum source 153 therethrough. In this manner, the adhesive sheet 50 is cut down by rotating a cutter 155 in the vicinity of an inner periphery end of the metal frame 55 with respect to the work 60, being held strongly by the chuck 150, thereby being separated or divided from the metal frame 55.

By the way, the chuck 150 must not be constructed with such the vacuum chuck, necessarily, as far as it is able to hold the each semiconductor chip strongly, therefore it may be constructed with, for example, a magnetic chuck or a freezing chuck (i.e., a chuck holding the group of semiconductor chips by a function of quick or rapid freezing of water on the chucking surface, while loosing it by defrost function thereof).

Figure 13A:
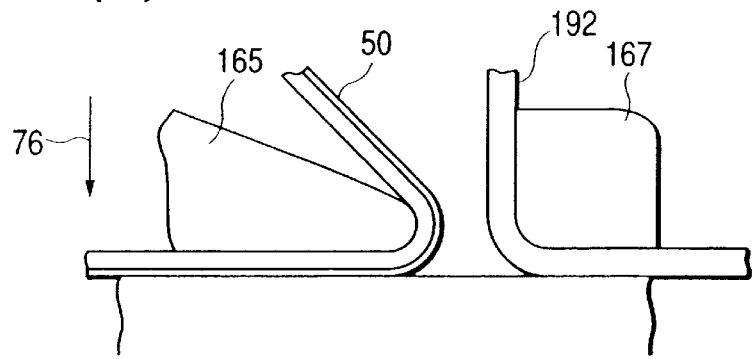
Figure 13B:
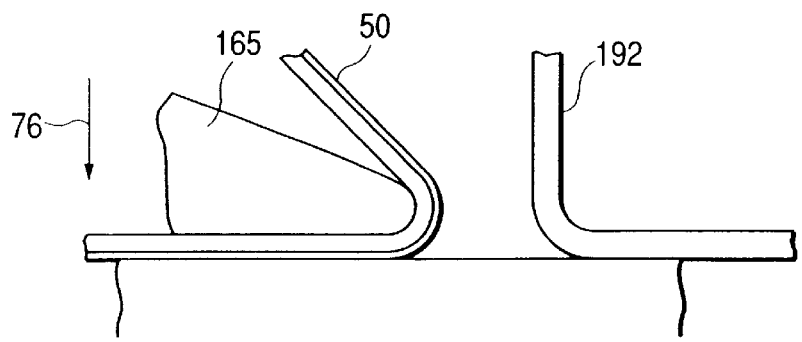
Figure 14:
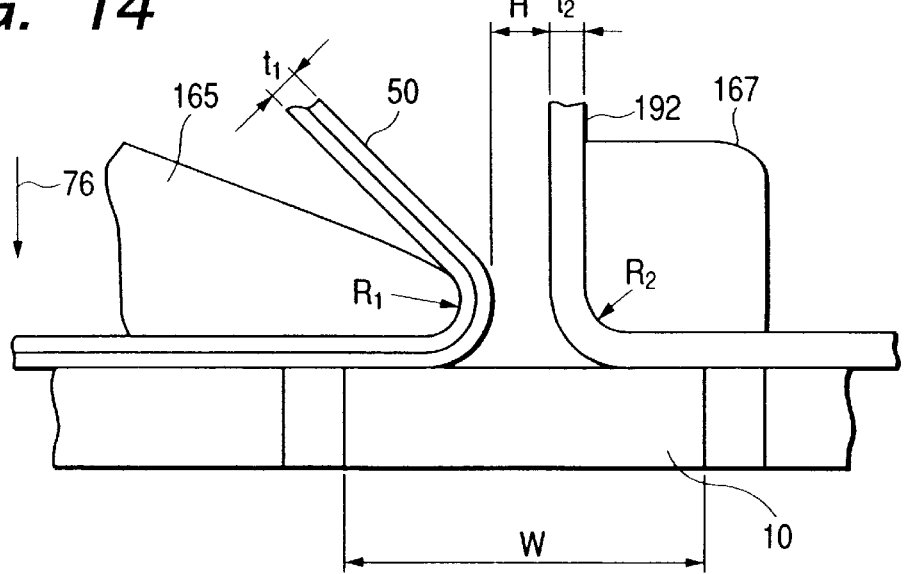
FIG. 14 is a view for showing sizes in the separation mechanism portion shown in the FIGS. 12(a) to (d)

Also, by varying or changing the vacuum pressure of the vacuum source 153 freely, it is also possible to bring the chucking force on the chuck 150 variable. In this one example, as shown in FIG. 30, the vacuum source 153 is constructed with installing an electromagnetic proportional valve 153b between a conduit 153a and a vacuum pump 153c, which can control flow amount by changing the voltage thereof. Accordingly, by changing the voltage to the electromagnetic proportional valve 153b from an outside to control, the vacuum pressure of the chuck 150 can be changed freely. Also, by controlling the vacuum pressure of the chuck 150, as shown in FIGS. 12 to 14, the pressure can be set to be variable, which is applied to a sheet (or a tape) 192 for suppression, in an opening portion thereof.

Figure 3A:
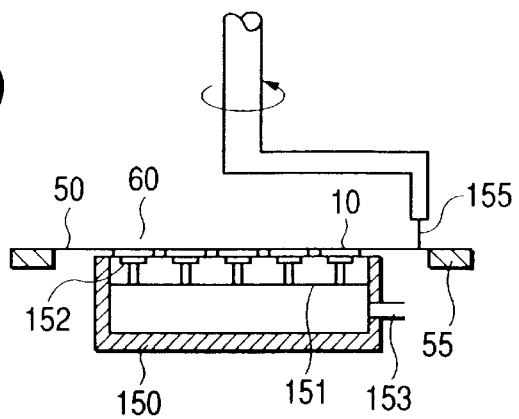
Figure 3B:
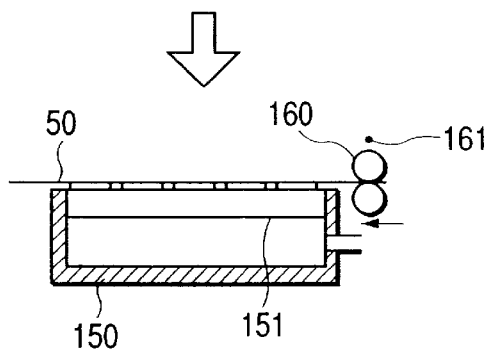
Figure 3C:
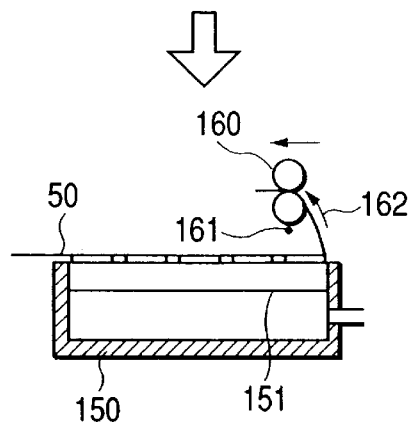

Next, as shown in the FIG. 3(b), the chuck 150 is moved close to a clump means 160 comprising a pair of clamp rollers relatively, so as to clamp an end of the adhesive sheet 50 separated from the metal frame 55 by the clump means (i.e., a stretching means) 160 comprising the pair of clamp rollers therewith.

Following to this, while further moving the chuck 150 and the clamp means 160 relatively, the clamp means 160 as a whole is rotated by 180 degree around an axis 161 as a center thereof, as indicated by an arrow 162, thereby the one end of the adhesive sheet 50 is in a condition that it is lifted upward.

Figure 3D:
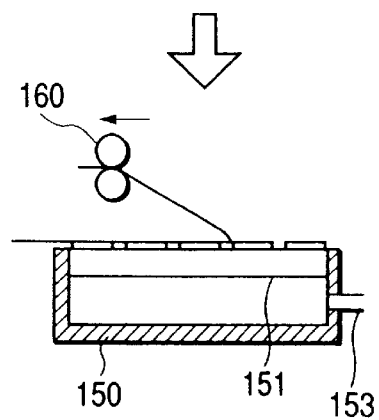

Successively, further moving the chuck 150 and the clamp means 160 relatively, as shown in the FIG. 3(d), the adhesive sheet 50, sticking to the group of thin semiconductor chips with the bonding force which is weaken remarkably by the irradiation of UV, is drawn into a side direction, thereby being peeled out or stripped from the thin semiconductor chips which are held on the chuck 150, without causing breakage thereof. Also in this embodiment, the adhesive sheet is stripped from the group of semiconductor chips by the tensile force acting thereon, therefore on each semiconductor chip, the adhesive sheet is removed or stripped from one end to the other end thereof. Therefore, it is possible to remove or strip the adhesive sheet 50 from all the thin semiconductor chips held on the chuck 150, without breaking nor injuring. Further, on the thin semiconductor chip 10, when the direction for stripping the adhesive sheet 50 is set so that it is peeled out from a corner of the semiconductor, it is possible to remove or strip it with further weak force.

Figure 4A:
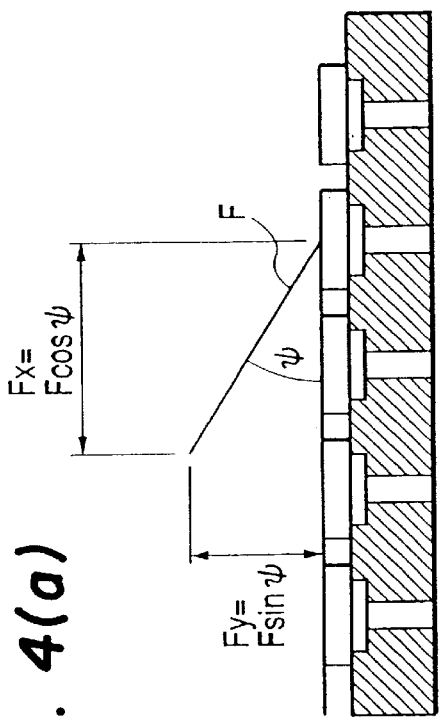
Figure 4B:
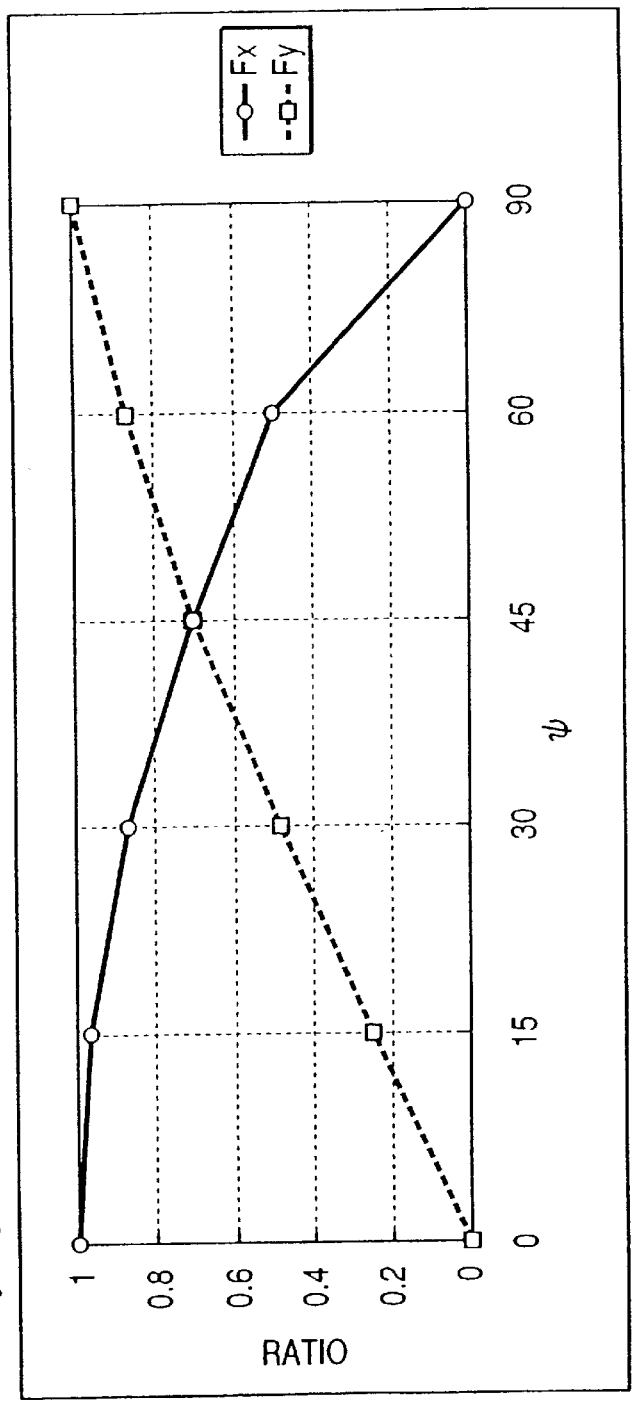

Namely, the FIG. 4(a) and FIG. 4(b) show a relationship between a direction angle $\psi$ in acting the tensile force F to a bonding surface on the semiconductor chip 10 and forces Fx and Fy acting upon the semiconductor chip 10, when the adhesive sheet 50 is removed or stripped from the group of thin semiconductor chips by the tensile force F acting thereon, in this embodiment. The stripping force Fx, in a relationship that it is approximated as Fx=Fcos$\psi$, the smaller the angle $\psi$, the bigger the stripping force can be obtained, then it is possible to remove or strip the adhesive sheet 50 from the group of thin semiconductor chips with ease. On the other hand, the force Fy, which is against a force of holding the semiconductor chip 10 to the chuck 150, comes to be small when the angle $\psi$ is small, therefore there is no need for increasing the holding power of the chuck 150 greatly, thereby enabling to reduce the possibility of breakage of the thin semiconductor chips 10, remarkably.

By the way, in relation with the material of the adhesive sheet 50 and the property (i.e., softness) of the adhesive as well, the thinner and the softer the adhesive sheet and the adhesive thereof, the smaller the separation angle from the semiconductor chip 10 (i.e., being smaller in a radius of curvature), and it is apparent that the adhesive sheet comes to contact closely to the jig 165 for fixing strip angle and be stripped with ease.

Figure 5A:
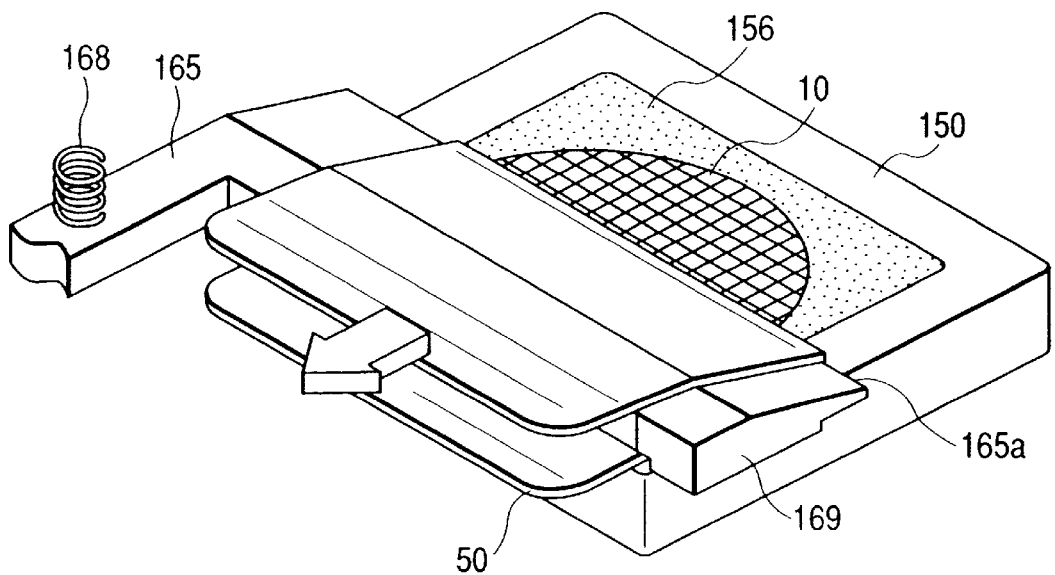

Then, for the purpose of securing that angle by making the angle $\psi$ of the direction of acting the tensile force F as small as possible, the wedge-like jig 165 is used for fixing the removal or strip angle (i.e., a forming mechanism) as shown in the FIGS. 5(a) and (b). This wedge-like jig 165 for fixing strip angle ensures the strip angle $\psi$, and it also achieves a function of concentrating the removal or strip forces by aligning in a line the strip positions on the group of thin semiconductor chips cut.

Figure 5B:
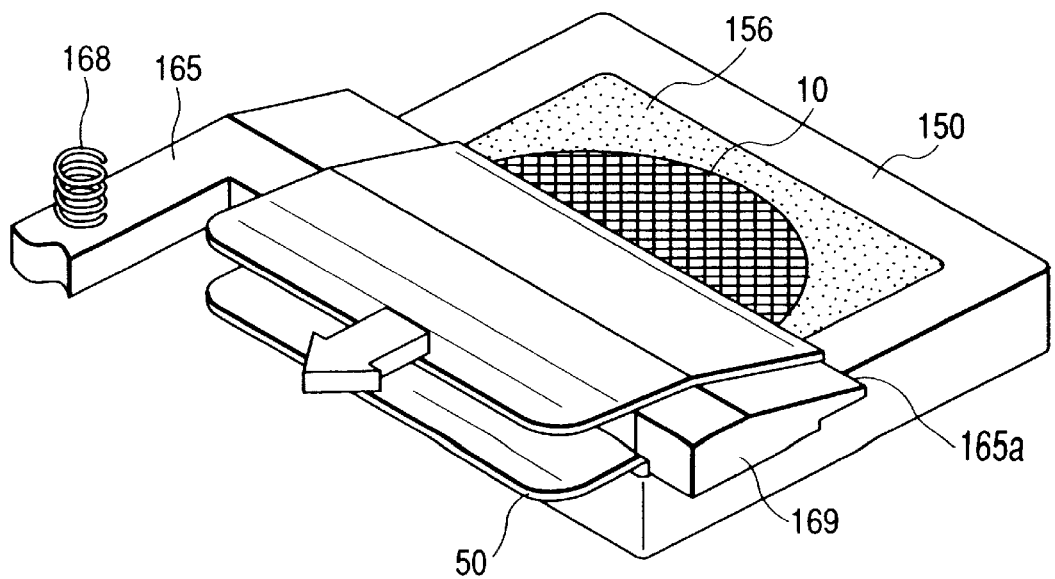
Figure 6:
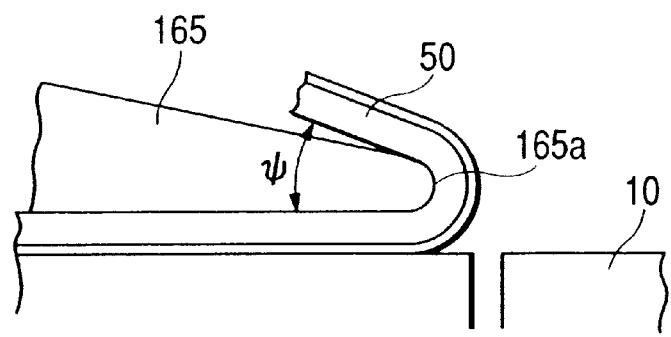

Further, at an edge 165a of the wedge-like strip angle fixing jig 165, as shown in the FIG. 6, is formed a curved surface (about 0.1 mm–20 mm in the radius thereof) against the adhesive sheet, so as to prevent from concentrating the removal or strip force at one point, thereby protecting from the breakage of the semiconductor chips 10. The smaller the radius of that curved surface, the more the strip force is concentrated, then the adhesive sheet can be removed easily. Of course, the thinner the thickness of the adhesive sheet, the smaller the radius of the curved surface, then the stripping force is concentrated. Also, from the relationship shown in the FIG. 4, it is apparent that the strip angle $\psi$ in the wedge-like jig 165 for fixing strip angle is preferably to be around from 10° to 20°. However, the trip angle $\psi$ may include that in a case where a position of the strip angle fixing jig 165 is mechanically changed. In this case, of course, the angle at the edge of the strip angle fixing jig 165 is smaller than around from 10° to 20° that mentioned in above. However, as a condition for moving the strip angle fixing jig 165, as shown in the FIGS. 5 and 6, there is a necessity to contact the strip angle fixing jig 165 to the adhesive sheet 50. For that purpose, it is enough that the strip angle fixing jig 165 is suppressed onto the adhesive sheet 50 by means of a suppression means 168 constructed with a spring member, etc. In this manner, by moving the strip angle fixing jig 165 while suppressing it by the suppression means 168, the stripping force for the adhesive sheet is concentrated at the edge portion 165a thereof, so as to prevent from increase in strip curvature thereof. Therefore, it is possible to reduce the possibility of breakage of the thin semiconductor chips 10, remarkably, and at the same time to maintain the absorption of the semiconductor chips 10 thereon. By moving the strip angle fixing jig 165 while suppressing it by the suppression means 168, it is possible to strip smoothly, with keeping the same strip curvature for an unevenness, even if the unevenness lies in the thickness of the semiconductor chip 10.

Figure 8:
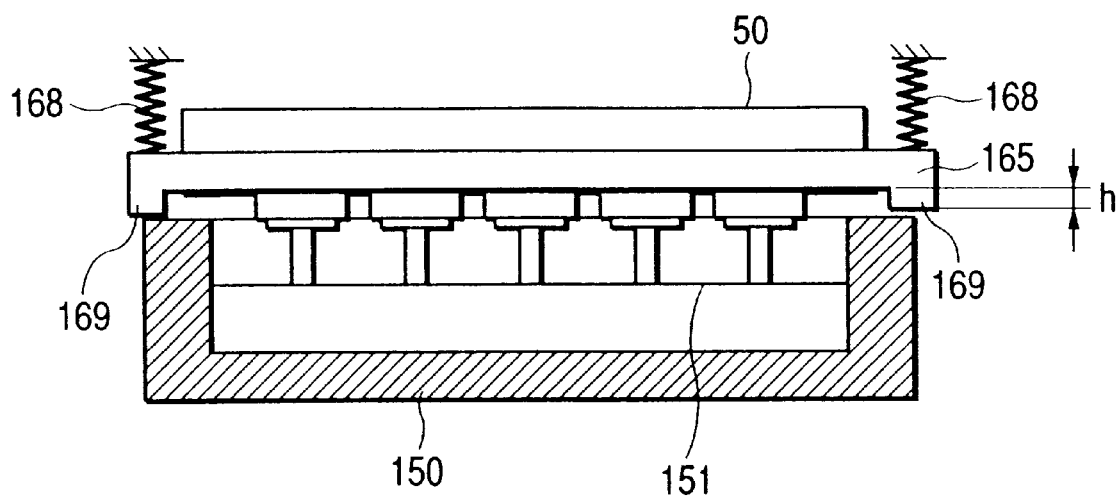
Figure 7A:
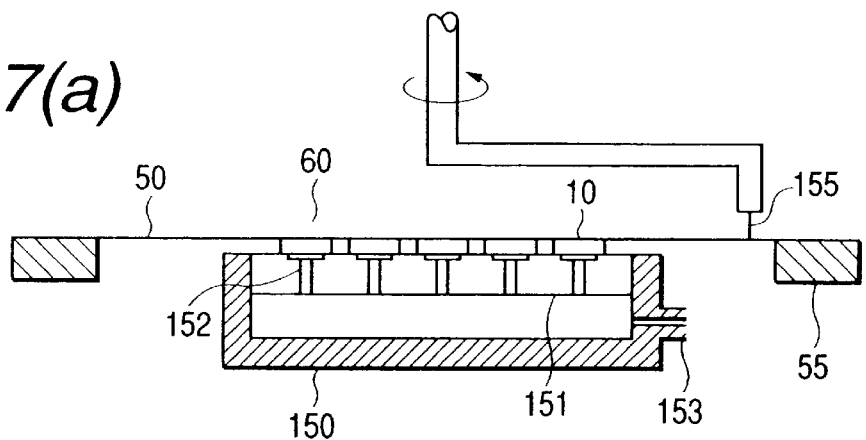
Figure 7B:
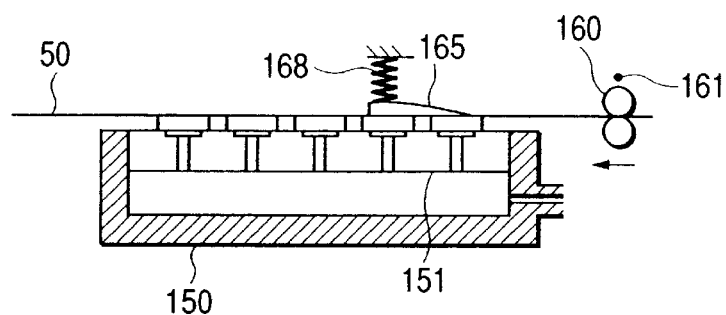

Further, the strip angle fixing jig 165 is so constructed that it is moved slightly by the suppressing force by the suppression means 168, therefore the strip angle fixing jig 165 is provided with projections 169 at both ends thereof, as shown in the FIGS. 5 and 8, for riding on smoothly, up to a position on the upper surface of the adhesive sheet 50 shown in the FIG. 7(b). The height of the projections 169 is smaller than the thickness of the semiconductor chip 10 a little bit, and it is so constructed that the projections 169 abut or contact with, for example, the upper surface in a periphery of the chuck 150 in an area where no semiconductor chip lies. Also, the suppression means 168 is so constructed that the suppressing force thereby can be varied depending upon the kinds of the semiconductor chip 10 (for example, depending on the thickness thereof). Namely, when the semiconductor chip 10 is thick in the thickness, the suppressing force by the suppression means 168 is weakened, while it is strengthen when the semiconductor chip 10 is thin in the thickness thereof, thereby enabling to strip the adhesive sheet smoothly, without breaking the semiconductor chips 10.

Figure 7C:
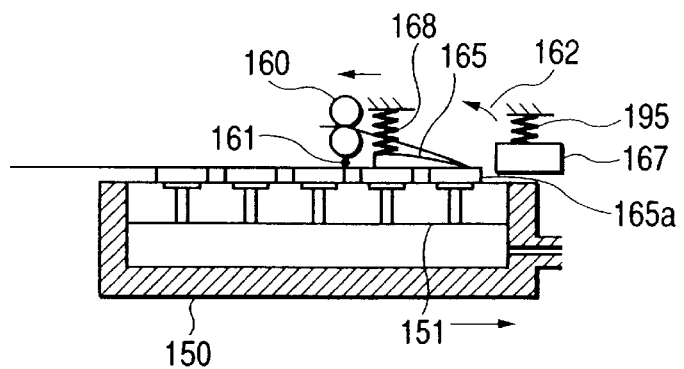
Figure 7D:
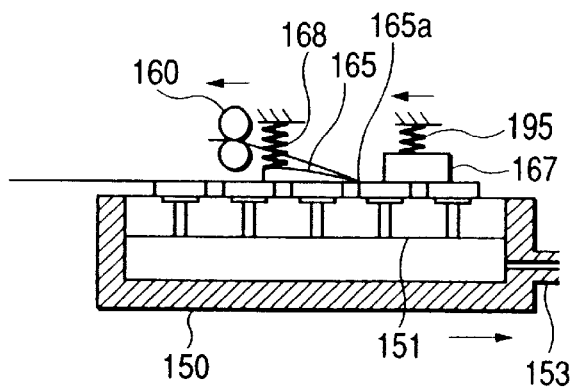

Next, explanation will be given on the separation mechanism (separating means) 100, in which is applied the wedge-like strip angle fixing jig (forming mechanism) 165, by referring to FIGS. 7(a) to (c). The FIGS. 7(a) and (b) are basically same to the FIGS. 3(a) and (b). Next, as shown in the FIG. 7 (b), the strip angle fixing jig 165 is suppressed onto the adhesive sheet 50 to contact with the upper surface thereof, and is located at the end of right-hand side thereof. Next, while moving the chuck 150 and the clamp means 160 relatively, the clamp means 160 as a whole is rotated around the axis 161 as the center thereof by an angle 180 degree, as shown by an arrow, thereby lifting the end of the adhesive sheet 50 upward, as shown in the FIG. 7 (c), so as to be in a condition that the adhesive sheet is bent at the edge 165a of the strip angle fixing jig 165 which is suppressed by the suppression means 168.

Next, while moving the clamp means (stretching means) 160 as a whole at a speed about at double (two (2) times) the moving speed of the strip angle fixing jig 165, the tensile force F is applied to the adhesive sheet 50 by the clamp means 160, thereby concentrating the strip force onto the adhesive sheet by the curvature formed at the edge 165a of the strip angle fixing jig 165, so as to remove or strip the adhesive sheet 50 smoothly from the end of the each semiconductor chip 10, one by one. In this manner, with such the construction in which the tensile force F is applied to the adhesive sheet 50 with applying a desired rotation torque by connecting an output of a torque motor to one of the rollers of the clamp means 160, the moving speed of the clamp means 160 as a whole may be about double the moving speed of the strip angle fixing jig 165. However, it may be also possible to construct that the strip angle fixing jig 165 is provided at a predetermined position while the chuck 150 is able be move in the direction of the arrow. However, so as to prevent from contacting with the upper surface of the chuck 150 when turning the strip angle fixing jig 165 back to the original position thereof, the strip angle fixing jig 165 may be elevated, or on the contrary to that the chuck 150 may be descended.

As was explained in the above, by using the strip angle fixing jig (forming means) 165 being suppressed by the suppression means 168, it is possible to ensure the strip angle ψ, and to concentrate the stripping force with aligning the stripping positions on a line for the group of thin semiconductor chips cut, thereby enabling to strip the adhesive sheet 50 therefrom, smoothly, without breaking the each thin semiconductor chip thereof. In particular, as shown in the FIG. 6, the force for absorbing and holding the semiconductor chips 10 is necessitated at the most when the edge 165a of the strip angle fixing jig 165 begins to strip the adhesive sheet 50 from the right-hand side end of the semiconductor chip 10, since the adhesive sheet 50 is stripped while being always suppressed on the semiconductor chip 10 through the strip angle fixing jig 165 by the suppression means 168, therefore it is possible to strip the adhesive sheet from the semiconductor chips while being absorbed and held on the chuck 150.

In particular, by making friction force upon the surface of the strip angle fixing jig 165 small, it is possible to reduce the curvature of the adhesive sheet at the edge portion thereof, so as to strip the adhesive sheet 50 from the semiconductor chips, smoothly.

Figure 9A:
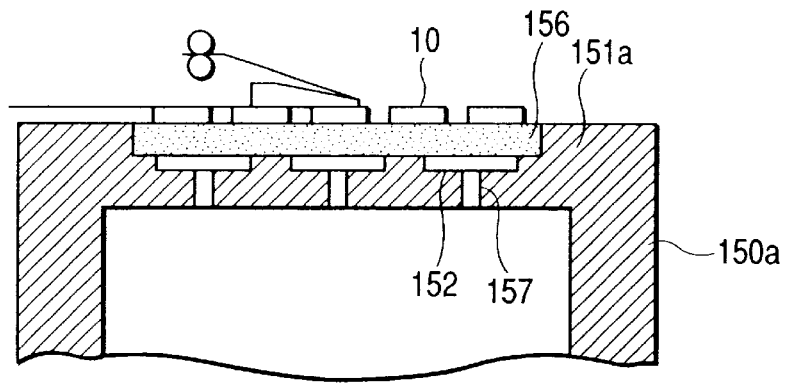
Figure 9B:
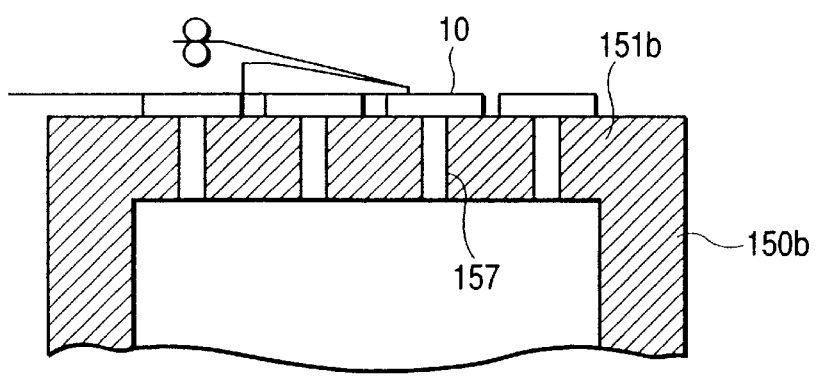
Figure 9C:
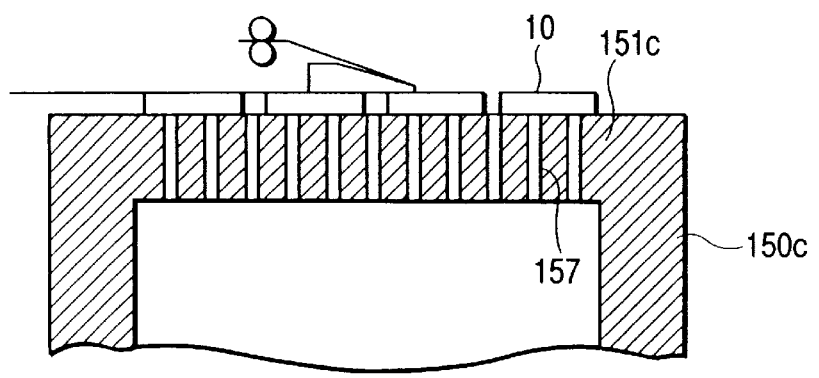
Figure 10A:
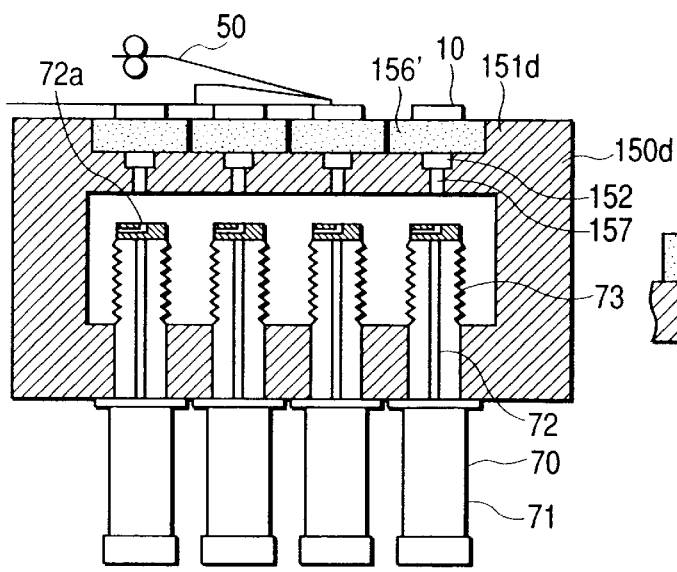
Figure 10B:
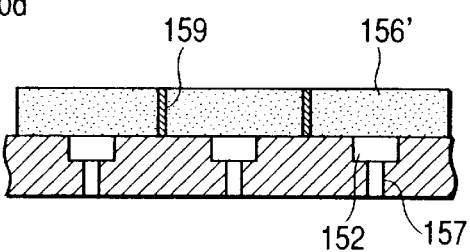

By the way, as the embodiment of the chuck 150, there can be considered such a construction as shown in FIGS. 9 and 10. Namely, the chuck 150a shown in the FIG. 9(a) is so constructed that, gutters or holes 152 being connected to a vacuum suction hole 157 are dug in a chucking surface member 151a at a predetermined distance, and on that is provided a porous absorption plate 156 formed of ceramics or the like, as shown in the FIGS. 5. In particular, in the porous absorption plate 156, since a plurality absorption holes are necessary for each the semiconductor chip, the porous absorption holes must be distributed equally over the whole surface thereof, and the ceramic material showing such the property is appropriate for it. With such the chuck 150a, there is no necessity to close the absorption holes other than those for the group of semiconductor chips, nor to fit the arrangement of the absorption holes to the alignment of the semiconductor chips 10. However, with using such the porous absorption plate 156, the absorption force is decreased down abruptly and greatly in proportion to as the adhesive sheet 50 is stripped. Then, as will be mentioned later, it is possible to prevent from the decrease (or reduce) in the vacuum force, for example, by covering with a tape 192 following the strip angle fixing jig 165.

Also, as shown in the FIG. 9(b), the chuck 150b is constructed with provision of vacuum absorption holes 157 on the chucking surface member 151b, in conformity with the alignment of the semiconductor chips. With such the chuck 150b, when holding on the chuck 150b the group of semiconductor chips, being adhered onto the adhesive sheet 50 which is attached on the metal frame 55, each semiconductor chip can be absorbed by each of the vacuum absorption holes 157 irrespective of occurrence of discrepancy in the position thereof, therefore it may be applied to the semiconductor chips 10 being large in sizes. Further, by treating with a layer of fluorocarbon polymer on the absorption surface, it is possible not only to ensure the absorption force, but also to absorb a circuit surface on which electrodes of the semiconductor chips are formed, with ensuring the holding force at a certain degree, but without injuring thereon. However, on the surface of the layer of fluorocarbon polymer is carried electrical charge, but it may be neutralized by ion blowing by an ion discharge means (not shown in the figures) sometimes, thereby giving no ill influence onto the semiconductor chips.

Also, the chuck 150c shown in the FIG. 9(c) is constructed by digging fine vacuum holes 157 at random, at a distance being smaller than the size of the semiconductor chip therebetween. Therefore, it shows an absorption property being near to that in the case of the porous absorption plate 156 shown in the FIG. 9(a). With this chuck 150c, there is no necessity of closing the absorption holes for those other than the group of semiconductor chips, nor necessity of fitting the arrangement of the absorption holes to the alignment of the semiconductor chips 10. However, when using this chuck 150c, the absorption force is decreased down in proportion to as the adhesive sheet 50 is stripped. Then, as will be mentioned later, the decrease of the vacuum force can or may be prevented by covering with the tape 192, for example, following the strip angle fixing jig 165.

Further, with the treatment of the fluorocarbon polymer layer on the absorption surface, it is possible not only to ensure the absorption force, but also to absorb the circuit surface on which electrodes of the semiconductor chips are formed, with ensuring the holding force at a certain degree, without injuring thereon. However, on the surface of the layer of fluorocarbon polymer is carried electrical charge, but also it may be neutralized by ion blowing with the ion discharge means (not shown in the figures) sometimes, thereby giving no ill influence onto the semiconductor chips.

And, the chuck 150d shown in the FIGS. 10(a) and (b) has the construction, wherein gutters or holes 152 being connected to the vacuum suction port or hole 157 are dug at a predetermined distance in the chucking surface material 151, on which is provided a porous absorption plate 156', being divided by a unit of the semiconductor chip with partition plates or an adhesive 159, or divided by a unit of a line(s) thereof about one (1) to three (3), along the edge 165a of the strip angle fixing jig 165 shown in the FIG. 5, and is further provided with a mechanism for closing each of the vacuum suction holes 157. The closing mechanism 70 is constructed with a cylinder-like drive source 71, an output member 72 for closing the each vacuum suction hole 157 by covering therewith as the output of the drive source 71, and a bellow or a vacuum seal 73 for maintaining the vacuum within a vacuum chamber. And, sequential driving of those closing means 70 may be conducted depending upon decrease in the vacuum pressure within the vacuum chamber or in conformity with the amount of movement of the strip angle fixing jig 165. However, at the edge portion of the output member 72 is dug a fine bore 72a for conducting between the vacuum suction hole 157 and the vacuum chamber when closing, thereby to hold the semiconductor chips 10 with a weak absorption force thereon. Also, without digging the fine bore 72a in the edge portion of the output member 72, it is also possible to bring a weak bonding or adhesive force between the upper surface of the porous absorption plate 156' and the semiconductor chips 10 in the place thereof.

Accordingly, closing the vacuum absorption holes, at the places where the semiconductor chips are absorbed with the vacuum, being removed with the adhesive sheet 50 completely therefrom, by the output members 72 being driven by the mechanism 70, sequentially, it is possible to prevent from the decrease in the vacuum absorption force caused following the separation of the adhesive sheet 50. However, the holding force caused by the absorption at that place can also be obtained through the fine bore 72a. Also, with bringing the weak bonding force between the porous absorption plate 156', it is also possible to make the chuck hold the semiconductor chips thereon. In any event, in a case of using the porous absorption plate 156, the vacuum absorption force is decreased down abruptly when beginning the strip or removal of the adhesive sheet 50, however with using the porous absorption plate 156' being divided by the partition plates or the adhesive 159 and the closing mechanism 70 as well, it is possible to reduce or suppress such the abrupt decrease of the vacuum absorption force or power.

And after completing the strip of the adhesive sheet 50, it is possible to hold all the semiconductor chips 10 with strong absorption force, by releasing all the vacuum absorption holes from the closure again through all the closing mechanism 70. Also, with dividing the porous absorption plate 156' and the closing mechanism provided therefor, into a unit of the semiconductor chip, the semiconductor chips can be picked up from the chuck 150d by a unit of the semiconductor chip, with actuating the closing mechanism 70 by that unit of the semiconductor chip. Further, with dividing the porous absorption plate 156' and the closing mechanism provided therefor, into a unit of a line of the semiconductor chips, the semiconductor chips also can be picked up from the chuck 150d by a unit of a line, with actuating the closing mechanism 70 by that unit of a line.

Figure 11A:
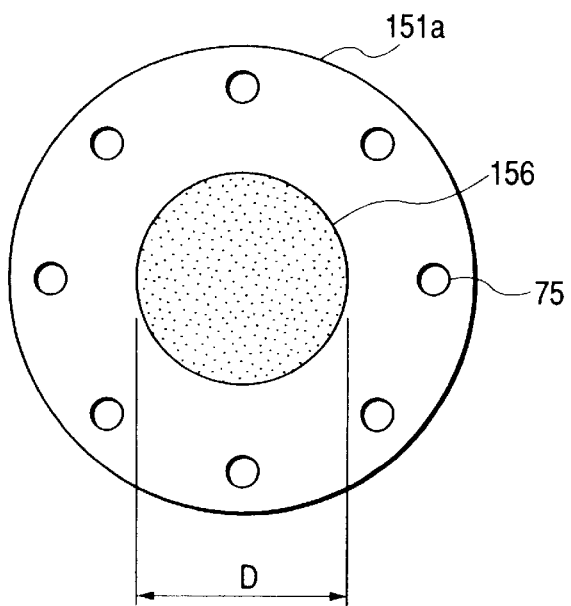
Figure 11B:
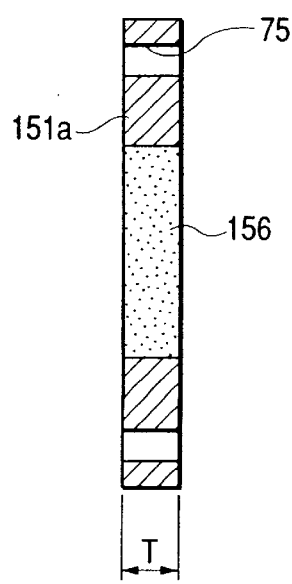
Figure 12A:
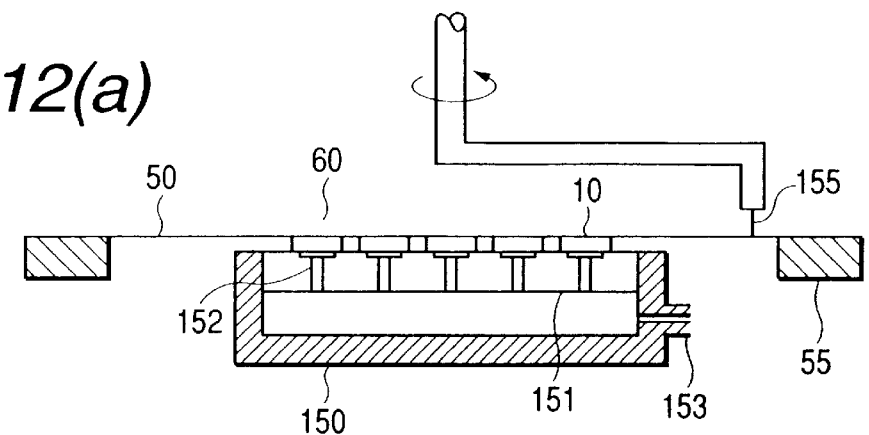
Figure 12B:
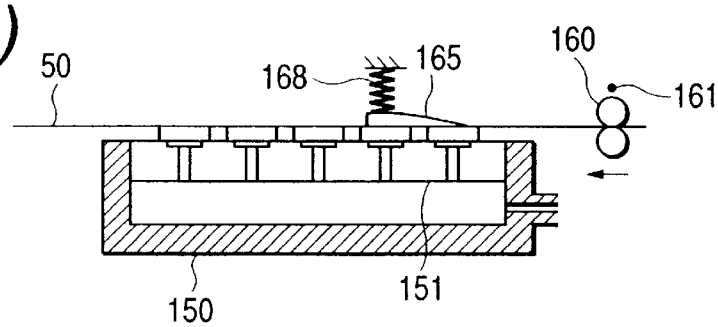
Figure 12C:
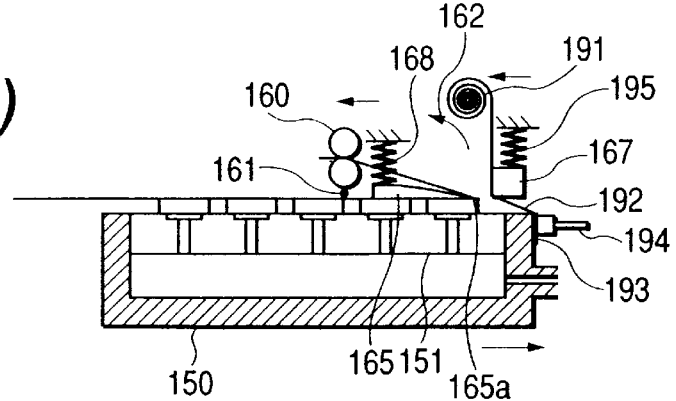
Figure 12D:
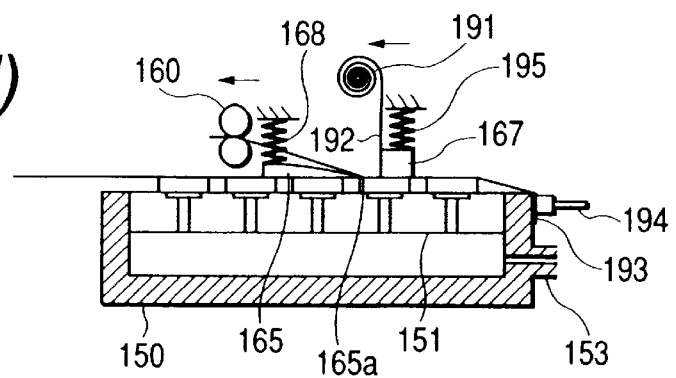

Also, as shown in the FIGS. 5 and 9(a), in a case of using the porous absorption plate 156 as the chuck 150a, the diameter D of the porous absorption plate 156 is made as agreeable with that of the semiconductor wafer as possible, then the are of the absorption surface can be reduced. As a result of this, it is possible to suppress a rate in decrease of the vacuum when holding the semiconductors by the vacuum, and therefore the vacuum pump can be managed to be small-sized in the capacity thereof. And, the holes 75 provided in the periphery of the chucking surface member 151a shown in the FIG. 11 are utilized to be attached on the main body of the chuck, by fitting them to the projections provided on the upper surface thereof for positioning.

Also, as shown in the FIGS. 7, the line of the semiconductor chips under the condition of being removed from the adhesive sheet, following just after the edge portion 165a of the strip angle fixing jig 165, are suppressed through the suppressing means 167 being suppressed with the suppression means 195, such as a spring, etc., therefore each the semiconductor chip 10 is always suppressed by either the strip angle fixing jig 165 being suppressed by the suppression means, or the suppressing means 167 being suppressed by the suppression means 195, necessarily, as a result of this, it is possible to hold on the chuck 150 the group of semiconductor chips being stripped with the adhesive sheet 50 therefrom, even when the absorption force is weak. Namely, an aperture H between the strip angle fixing jig 165 and the suppressing means 167 is made smaller than the size W of the semiconductor chip, then it is possible to suppress the each semiconductor chip 10 with either one of them, i.e., the strip angle fixing jig 165 or the suppressing means 167, necessarily. The suppressing means 167 is able to show that effect of suppressing the semiconductor chip 10, in particular, when the edge portion 165a of the strip angle fixing jig 165 is located in the vicinity of the left-hand side end of the semiconductor chips. In this instance, after the one end of the adhesive sheet 50 must be lifted up, i.e., from a condition shown in the FIG. 7(b) to that shown in the FIG. 7(c), to be bent at the edge 165a of the strip angle fixing jig 165, it must proceed following just after the edge portion 165a of the strip angle fixing jig 165, from the condition that the suppressing means 167 is moved backward. Further in this case, the suppressing means 167 may be construct with attaching a rotating longitudinal roller at the tip thereof, thereby moving it relatively between the chuck 150, so as to follow just after the edge portion 165a of the strip angle fixing jig 165.

Next, explanation will be given on another method for preventing from the decrease in the vacuum absorption force, being caused accompanying with the separation of the adhesive sheet 50, with provision of the porous absorption plate 156 or the large number of the small vacuum absorption holes on the chucking surface. Namely, as shown in the FIGS. 12(a) to (d), by covering the line of semiconductor chips as a whole, including those under the condition of being stripped with the adhesive sheet 50 therefrom, with a tape 192 released from a reel 191, in a manner of following just after the edge portion 165a of the strip angle fixing jig 165, the suction or absorption force of the chuck 150 can be prevented from being decreased down, thereby enabling to maintain the absorption force acting through the chuck 150 upon the semiconductor chips to be removed from the adhesive sheet 50. Namely, the tip 193 of the tape 192 is fixed on the chuck 150 with a pushing means 194, such as a pusher, while the suppressing means 167 of metal, being suppressed by the suppression means 195, such as the spring, is moved relatively between the chuck 150, thereby releasing the tape 192 from the reel 191. This is shown diagrammatically in FIG. 13(a).

Here, it is also possible to change or vary the suppression force applied onto the tape 192 through the suppressing means 167 by the suppression means 195, such as the spring, depending upon the thickness of the semiconductor chip 10 and/or the material thereof.

Further, after being fixed on the chuck 150 at the tip portion thereof, the tape 192, if it is led out from the reel 191 in beginning, can be sucked thereafter with the absorbing force leaking from the chuck 150. And, as a result of this, as shown in the FIG. 13(b), covering the tape 192 over the line of semiconductor chips as a whole, including those just under the condition of being removed with the adhesive sheet 50 therefrom, following just after the edge portion 165a of the strip angle fixing jig 165, the suction force of the chuck 150 can be prevented from being decreased down, thereby enabling to maintain the absorption force of the chuck 150 upon the semiconductor chips to be removed from the adhesive sheet 50.

In particular, as shown in FIG. 14, in a case where the semiconductor chip 10 comes to be small in the size(s), the aperture between the edge portion 165a of the strip angle fixing jig 165 and the tape 192 following must be small. Namely, there is a necessity that it satisfies a relationship of the following equation (1):

$$W > t1 + t2 + R1 + R2 \tag{1}$$

where, W indicates the size of the semiconductor chip 10, t1 the thickness of the adhesive sheet 50 (including the adhesive thereof), t2 the thickness of the tape 192, Ri the radius of the edge portion 165a of the strip angle fixing jig 165, and R2 the radius of the suppressing means 167 of metal.

Then, assuming that R1 and R2 be about 0.1 mm, t1 about 0.065 mm, t2 about 0.05 mm, and the aperture H 0.1 mm, the semiconductor chips up to the size W of about 0.415 mm (W=0.415 mm) can be removed from the adhesive sheet 50, smoothly under the condition of being absorbed with the vacuum. Also, covering the semiconductor chips stripped with the adhesive sheet 50 therefrom by means of the tape 192, thereby it is possible to prevent the absorption force from being decreased down.

Also, the absorption force acting upon each of the semiconductor ships 10 is proportional to the product between an absorption area on the each semiconductor chip 10 and a degree of vacuum. On the other hand, the striping force to each semiconductor chip 10 is proportional to the product between the size W of the semiconductor chip 10 and the bonding force on the adhesive sheet 50. Accordingly, it is preferable the bigger the size W of the semiconductor chip 10, the higher the degree of vacuum.

And, the direction of stripping the adhesive sheet 50 with respect to the group of cut semiconductor chips is in a direction of alignment of the semiconductor chips, as shown in the FIG. 5(a), or in a direction being inclined (for example, by about 40°) with respect to the direction of alignment of the semiconductor chips, as shown in the FIG. 5(b). In the case shown in the FIG. 5(b), the adhesive sheet is begun to be stripped or removed with respect to each the semiconductor chip from the corner thereof, then it can be easily removed comparing to the case shown in the FIG. 5(a). In this case, the force being acting upon each the semiconductor chip comes to be the maximum at the center thereof and it is decreased down as far as it comes down to both ends thereof, therefore it is advantageous from view point of holding the semiconductor chip with such the absorption.

Figure 15:
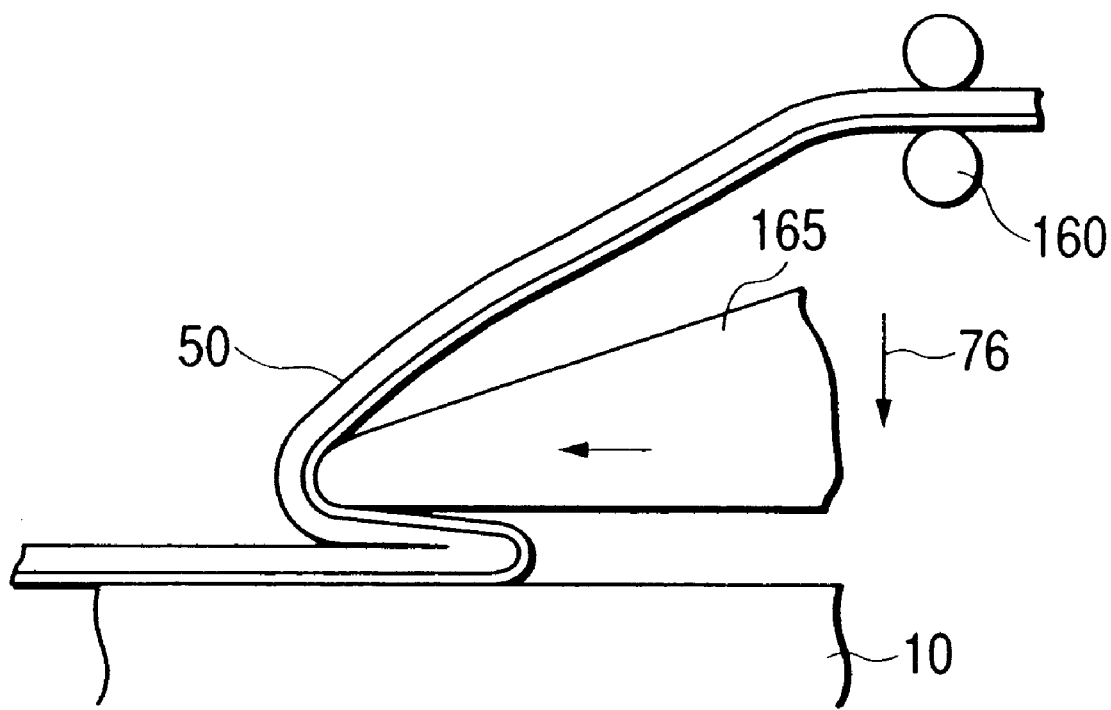
FIG. 15 is a view for explaining an embodiment using the strip angle fixing jig, which brings a separation angle of the adhesive tape at the minimum in the separation mechanism portion, according to the present invention.

Further, as the method for stripping the adhesive sheet 50 from the alignment of semiconductor chips with using the strip angle fixing jig 165, there is also another method shown in FIG. 15. In this method, with suppressing or pushing upon the strip angle fixing jig 165 to the adhesive sheet 50 while stretching the adhesive sheet 50 with a desired tensile force by means of the clamp means 160, a fold back portion of the adhesive sheet 50 is formed at a lower surface of the edge of strip angle fixing jig 165, thereby to strip or remove the adhesive sheet 50 from the alignment of the semiconductor chips. Further, in this case, it is enough to form an aperture, being a little bit larger than two pieces of the adhesive sheet, between the lower surface of the strip angle fixing jig 165 and the upper surface of the semiconductor chip, i.e., there is not necessarily a need of suppressing the strip angle fixing jig 165 downward as shown by an arrow 76. In a case if the strip angle fixing jig 165 is suppressed downward as shown by the arrow 76, it may be suppressed with a very weak force. According to this method, it is possible to remove or strip the adhesive sheet 50 from the alignment of semiconductor chips while bringing the separation angle of the adhesive sheet 50 at the minimum, therefore the adhesive sheet 50 can be removed from the alignment of semiconductor chips, even with the weak vacuum absorption force upon the alignment of semiconductor chips with the chuck 150. Also, with bringing the separation angle of the adhesive sheet 50 at the minimum, the adhesive agent, being hardened by irradiation of the ultraviolet rays and decreased in the bonding force thereof, can be cracked with ease to be stripped or removed therefrom.

By the way, since the number of the semiconductor chips attached or stuck onto the adhesive sheet 50 is decreased down greatly, in proportion as the strip of the adhesive sheet 50 comes close to the end with respect to the semiconductor chips being held on the chuck 150, then a large force, as a reaction of the removing force Fx, acts upon the semiconductor chips held on the chuck 150 to move them in a horizontal direction, therefore it sometimes occur an occasion that the adhesive sheet cannot be removed or stripped from the semiconductor chips in a small number thereof. Even when the adhesive sheet can be stripped therefrom, but the horizontal shift occurs on the semiconductor chip, therefore the semiconductor chip cannot be picked up, or it contacts on the chips removed, thereby occurring the break thereof. Then, the terminal end of the adhesive sheet 50 is fixed provisionally on the periphery (i.e., the frame) of the chuck 150, thereby enabling to prevent the semiconductor chip from moving or shifting off from the absorbing surface in the horizontal direction.

Figure 16:
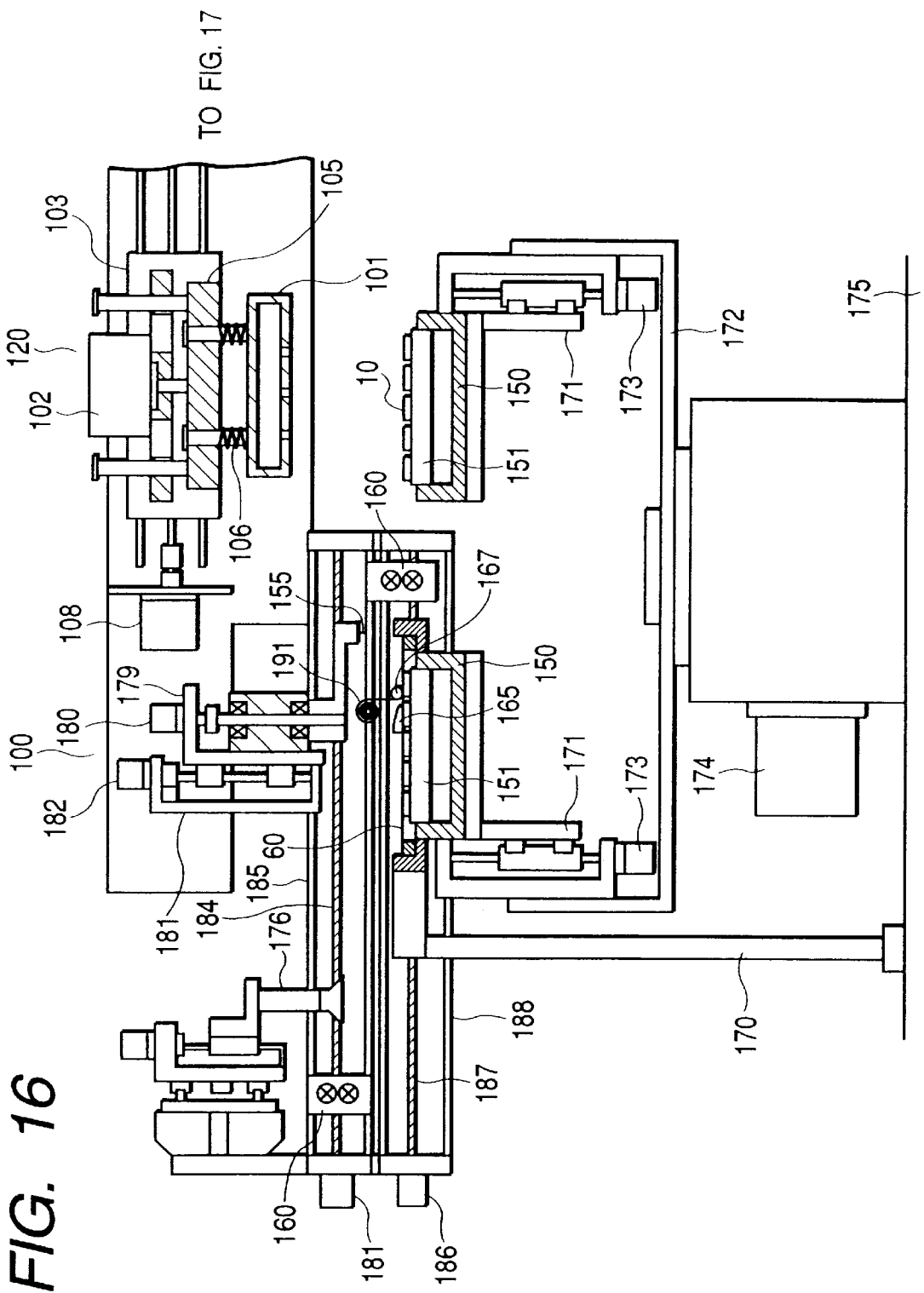
FIG. 16 is a structure view of showing the separation mechanism portion in an embodiment of the entire system, wherein the thin semiconductor chips are cut out by dicing from the condition of a thin semiconductor wafer, thereby to be mounted, according to the present invention.
Figure 18A:
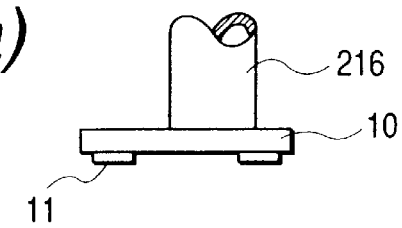
Figure 18B:
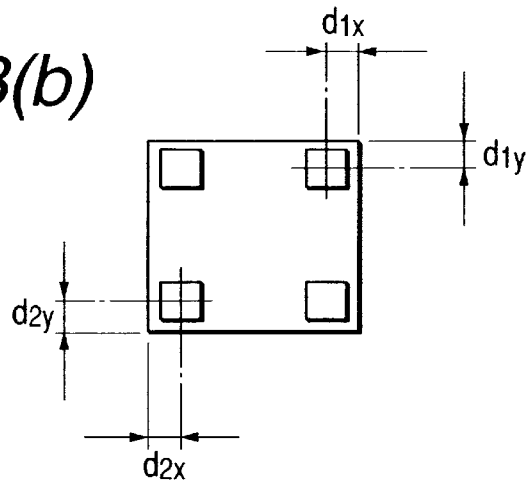
Figure 18C:
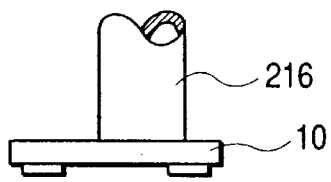
Figure 18D:
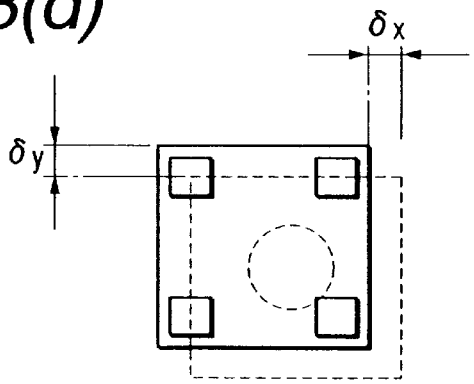

Next, explanation will be given on a concrete embodiment of the separation mechanism portion (separation means) 100 by referring to FIG. 16. The work 60 is supplied with directing the side of the adhesive sheet 50 upward into a separation station for separating the adhesive sheet, by a convey means 170 which can also move backward, thereby the metal frame 5 is positioned to be fixed thereon.

The chucks 150 are provided by two (2) thereof on an index stage 172, and are so constructed that the removal of the adhesive sheet 50 is conducted in parallel with the picking up of the alignment of the semiconductor chips, being stripped with the adhesive sheet 50 therefrom. Each of the chucks 150 is attached on each of supporting members 171. Each of the said supporting members 171 is provided on a base 175, and is supported to be elevated by a driving force from a drive source 173, with respect to the index stage 172 which is indexed by the driving force from another drive source 174. Accordingly, in the separation station, by lifting up the chuck 150 to apply a chucking force, the chuck 150 holds strongly the semiconductor chips of the work 60 fixed onto the supporting member 171, upon the whole surface of the semiconductor chips on which the electrodes 11 thereof are formed. A support member 179 for supporting a rotation member 178 attached with a cutter 155 is descended by driving a drive source 182, and the periphery of the adhesive sheet is cut down with the cutter 155 attached at the tip of the rotation member 178, by rotating the rotation member 178 through driving of a drive source 180, thereby cutting off the metal frame 55 from the adhesive sheet 50. Further, a reference numeral 180 indicates a member for supporting the support member 179 to be elevated.

Next, the chuck 150 is descended by driving the drive source 173 while rising up the cutter 155, so as to move the convey means 170 backward, and the chuck 150 is raised up again, thereby bringing a starting end of the adhesive sheet 50 into a condition that it can be clamped by the clamp means 160, comprising a pair of clamps therewith. Said the clamp means 160 further comprises a moving mechanism (being constructed with a guide rail and a mechanism of a sending screw 184) 185 having a drive source 181 for moving in the horizontal direction, and a rotation mechanism (not shown in the figures) having a drive source (not shown in the figures) for rotating it by 180 degree. Further, the support member, for supporting the strip angle fixing jig 165 being movable a little bit up and down, further for supporting the reel 191 receiving the tape 192 wound therein, and also for supporting the suppressing means 167 of metal being movable a little bit up and down, is attached on a moving mechanism (being constructed with a guide rail and a mechanism of a sending screw 187) having a drive source for moving it in the horizontal direction. Accordingly, as shown in the FIG. 14, it is possible to move the strip angle fixing jig 165 and the suppressing means 167 together in the horizontal direction with keeping a predetermined distance H therebetween. However, the reel 191 and the suppressing means 167 must be moved backward on the support member mentioned above, until when the starting end of the adhesive sheet is clamped and is rotated by 180 degree.

Next, as was mentioned previously, after clamping the starting end of the adhesive sheet 50 by the clamp means 160, while bending or folding the adhesive sheet at the edge 165a of the strip angle fixing jig 165 suppressed by the suppression means 168, and further releasing the tape 192 from the reel 191 by the suppressing means 167 suppressed by the suppression means 195, following the strip angle fixing jig 165, so as to cover the group of semiconductor chips stripped with the adhesive sheet therefrom, in accordance with the relative operations between the chuck 150 and the clamp means 160 and between the strip angle fixing jig 165 and the suppressing means 167, the adhesive tape 50 is stripped from the group of thin semiconductor chips held on the chuck 150 smoothly without bringing decrease in the absorption force by the chuck 150, and the stripped adhesive sheet is removed or eliminated by absorbing it with a absorption means 176.

Next, by rotating the index stage 172, the group of thin semiconductor chips separated with the adhesive sheet 50 therefrom are moved from the separation station to the pickup station.

In the pickup station, the chucking force upon the group of thin semiconductor chips on the chuck 150 is weakened, then while descending a moving block 105 by controlling drive of the drive source 102, such as a cylinder, the absorption collet 101 is descended, thereby suppressing the spring member 106, so that the tip of the collet 101 is brought to contact with such as a unit of one (1) line of the group 20 of thin semiconductor chips being removed from the adhesive sheet 50, or the collet 101 absorbs such as a unit of one (1) line of the group 20 with a little aperture therebetween. Then the collet 101 is raised up accompanying rise up of the moving block 105, thereby separating or dividing the group 20 of thin semiconductor chips, by the unit of, such as one (1) line thereof, from the adhesive sheet 50. Namely, in the pickup station, for the purpose of picking up the group of semiconductor chips, including a large number of lines thereof for example, by the unit of one (1) line thereof, from the indexed chuck 150 by means of the absorption collet 101, there is a need that the mechanism for moving the above-mentioned chuck 150 or the absorption collet 101 relatively, in a direction vertical to the surface on paper of the FIG. 16. With this, it is possible for the absorption collet 101 to pick up the group 20 of thin semiconductor chips in the unit of one (1) line thereof, sequentially, from the groups of the semiconductor chips including a large number of the lines on the chuck 150.

Further, through a transfer mechanism 109 being driven with a drive source 108, the absorption collet 101 absorbing the group 20 of thin semiconductor chips in a form of the unit of one (1) line is moved to the separation conveyer portion 200 together with a support member 103, as shown in the FIG. 17. Thereafter, driving the drive source 102, such as the cylinder, etc., to control, the moving block 105 is descended while also descending the absorption collet 101 at the same time, and the spring member 106 is suppressed, so as to contact such as the unit of the one (1) line of the group 20 of thin semiconductor chips with the conveyer. And then, the absorption by the absorption collet 101 is released, thereby, such as the group 20 of thin semiconductor chips in the form of the unit of one (1) line can be put on the conveyer 201. With the mentioned in the above, it is possible to mount the semiconductor chips by each of groups thereof, such as the unit of one (1) line, by absorbing the surface opposite to the front surface formed with electrodes thereof, with directing that surface formed with electrode downward.

Next, explanation will be given on a first embodiment of an entire system for dicing (cutting) the thin semiconductor chips (semiconductor elements) out of the condition of the semiconductor wafer (semiconductor substrate) to be packed into the tray or to be mounted on a circuit board constructing an IC card or the like. The separation mechanism 100 will be omitted to be explained since it was already explained in the above. The separation conveyer portion 200 is provided on a base 218, and comprises: a conveyer 201 for transferring the groups of thin semiconductor chips (semiconductor elements) which are carried in by the absorption collet 101 of the separation mechanism portion 100 and are in the condition of lines thereof; a sensor 202 for detecting the bad or poor quality chips which are marked on the semiconductor chips transferred on the conveyer 201, thereby to detect a fact that an enough space can be ensured for mounting therein the group 20 of thin semiconductor chips (semiconductor elements) to be transferred by the conveyer 201 and to be mounted by the absorption collet 101; a sensor 203 for detecting that the semiconductor chips transferred by the conveyer 201 come into a separation position; a discharge means being constructed with a shoot 206 for discharging the bad or poor quality semiconductor chips when the sensor 203 detects that these chips detected by the sensor 202 come into the separation position, and a collecting reservoir or container 207; a means 250 transferring the good quality semiconductor chips from the conveyer 201 to a conveyer 251; the conveyer 251 for transferring the good quality semiconductor chips; an image pickup means 209 for measuring the outer configurations of the semiconductor chips transferred on the conveyer 251; and a transfer mechanism 230 for absorbing the semiconductor chips 10 transferred on the conveyer 251 by means of an absorption nozzle 216 so as to transfer them to the tray packing portion (mounting mechanism portion) 300. In a case of this embodiment, as shown in the FIG. 16, the groups 20 of thin semiconductor chips are mounted on the conveyer 201 directing the surfaces formed with electrodes downward, in the separation conveyer portion (transfer means) 200, therefore such the reversing mechanism 208 shown in the FIG. 1 is not necessary to be provided.

By the way, the transfer mechanism 230 mentioned above is constructed with: a movement portion 210 for moving along with a guide 212; a drive source 211 for moving the movement portion 210 through a transfer mechanism 213; and a block 215 equipped with an absorption nozzle, being supported on the movement portion 210 so that it can elevated up and down. Also, the above-mentioned sensors 202 and 203, the image pickup means 209, and the drive sources 211, 214, etc., for driving the conveyer 201, and those of the transfer mechanism 230 are connected to a controller (not shown in the figure). And the controller controls the various drive sources 211 and 214 to drive them on the basis of information obtained from the sensors 202 and 203 and the image pickup means 209, etc.

Accordingly, when the fact is detected by the sensor 202 that the space is ensured t be enough for mounting the group 20 of thin semiconductor chips (semiconductor elements) thereon, they are carried in from the separation mechanism portion 100 by means of the absorption collet 101 to be mounted on the conveyer 201. Also, the bad quality semiconductor chips marked are detected by means of the sensor 202. And, when they are conveyed by the conveyer 201 and come into the separation position to be detected by the sensor 203 by each, a nozzle of a transfer means 250 is extended to be descended so that the good qualiy semiconductor chip is absorbed to be transferred onto the conveyer 251. And the outer configure of the semiconductor chip is measured by the image pickup means 209 to be inputted into the controller. Actually, with this image pickup sensor 209 is taken an image of the side surface on which no such the electrodes 11 is formed, therefore can be obtained information of only the outer configuration thereof, and the semiconductor chip 10 is absorbed onto the absorption nozzle 1 on the basis of this information. Namely, as shown in the FIGS. 18($c$) and ($d$), the position information ($\delta x$, $\delta y$) with respect to the absorption nozzle 216, which is depicted by a broken line in the FIG. 18 ($d$), on the semiconductor chip 10 absorbed onto the absorption nozzle 216, which is depicted by a solid line, can be obtained from the information only on the outer configuration measured by the image pickup means 209, and is inputted into the controller.

Further, the chips conveyed on the conveyer 251 is picked up onto the absorption nozzle 216 of the convey mechanism 230 to be carried up to the mounting mechanism portion (tray packing portion) 300.

In the mounting mechanism portion (tray packing portion) 300, the semiconductor chip, being carried by the conveyer mechanism 230 with being absorbed on the absorption nozzle 216, can be mounted on a tray(s) 2 or a circuit board(s) 30 forming an IC card or the like, which is/are mounted on X-Y stages 302 and 303 provided on the base 307 to be positioned therewith, by only descending the absorption nozzle 216 (i.e., tray packing is possible for the tray 2). In particular, when mounting the semiconductor chip(s) on the circuit board 30, it/they must be mounted with positioning the electrodes 11 formed on the semiconductor chip and those formed on the circuit board 30. By the way, the image pickup means 306 is provided on a route through which the semiconductor chips absorbed on the absorption nozzle 216 are conveyed, so as to pick up an image of the semiconductor chips at a side on which the electrodes 11 are formed, and the positions (d1x, d1y) and (d2x, d2y) of the respective electrodes (pads) 11 are measured upon the basis of the outer configuration thereof to be inputted into the controller 80. To the bitter end, the semiconductor chip 10 is conveyed at a determined distance up to the mounting mechanism portion 300 by the conveyer mechanism 230 on the basis of the absorption nozzle 216. On the other hand, in the mounting mechanism portion 300, the position information is necessary for each of the electrodes 11 formed on the semiconductor chip, upon the basis of the absorption nozzle 216. This position information of the each electrode 11, in the controller, can be calculated out upon the basis of the position information (d1x, d1y) and (d2x, d2y) of the each electrode (pad) 11 standardized on the outer configuration obtained by the image pickup means 306 and the position information ($\delta x$, $\delta y$) of the outer configuration picked up by the image pickup means 209 standardized on the absorption nozzle.

And, the position information of the electrodes formed on the circuit board(s) to be connected with the electrodes 11 formed on the semiconductor chip is inputted into the controller to be memorized in a memory device thereof, in advance. Accordingly, when mounting the semiconductor chip(s) on the circuit board 30, the controller controls the drive sources 304 and 305 for driving the X-Y stages 302 and 303 to position the X-Y stages 302 and 303, upon the basis of the calculated position information of the electrodes formed on the circuit board and the position information of the each electrode 11 formed on the semiconductor chip standardized by the above-mentioned absorption nozzle 216, thereby it is possible to connect the electrodes formed on the semiconductor chip to the electrodes formed on the circuit board by using a bonding material or so on. When mounting on (or storing in) the tray 2, since no positioning is required, the control is simple.

Further, though the explanation was given on a case where the bad quality semiconductor chip(s) is/are detected by the sensor 202 in the separation conveyer portion 200, however as mentioned previously, since the position information about the bad quality semiconductor chip(s), as shown in the FIGS. 19($a$) and ($b$), is detected by checking on the coordinate of the semiconductor wafer (shown in the FIG. 19($c$)), the bad quality semiconductor chip(s) can be removed by the discharge means 206 and 207 in the separation position if inputting that position information into the controller.

Next, explanation will be given on an embodiment in which the separation mechanism portion 100 is made a vertical type. FIG. 20 is a diagram for showing the embodiment in which the separation mechanism portion 100 is made a vertical type. The separation mechanism portion 100 is made the vertical type so that a large number of them can be arranged in a line, and a mechanism must be added for enabling to convert an action, for conveying the absorption collet 101a within an absorption collet portion 120a formed with a conveying mechanism, from the horizontal direction into the vertical direction. In this manner, when the separation mechanism portion 100 is made the vertical type, the action for conveying the absorption collet 101, shown by a reference numeral 130 in the FIG. 1, to the separation conveyer portion 200 must be in both vertical and horizontal. However, by making the separation mechanism portion 100 the vertical type, a plurality of the separation mechanism portions 100 can be arranged in a line, and the much more group 20 of semiconductor chips can be supplied in a condition of the line to the separation conveyer portion 200.

Next, explanation will be given on another embodiment of the absorption collet portion 120, by referring to FIG. 21. Namely, when the semiconductor chip is small, such as from 0.4 mm to 0.5 mm in the size thereof, it is difficult to fit between the arrangement of the semiconductor chips held on the chuck 150 and the absorption holes of the absorption collet 101 in the positions thereof, however it is possible to pick up the group of semiconductor chips in the condition of a line (by a unit of a line or collectively as a whole surface) from the chuck 150, with the construction of the absorption collet 101 provided with an absorption collet 101b, having the porous absorption plate 77 of ceramics or the like on the absorption surface thereof, in the same manner as the chuck 150, or the construction of an absorption collet 101c formed with very fine absorption bores at random and with high density thereof on the absorption surface.

When absorbing the group of semiconductor chips from the chuck 150 by means of the absorption collet 101, collectively, as a whole surface, so as to be mounted on a convey system 201, it may be constructed so that the absorption nozzle 216 for picking up the semiconductor chips is made to be movable in two dimensions of x and y, from the convey system 201.

Further, when the semiconductor chip is large in the size, a large number of lines of the group of semiconductor chips are picked up from the chuck 150 at one time, with using an absorption collet 101d, and when mounting them on the convey system 201, they also can be mounted under the condition of one (1) line, for example, by selectively actuating a mechanism for closing the absorption holes. Also, the semiconductor wafer has a circular shape, on the other hand the absorption collet are dug with a determined number of the absorption holes, therefore when the absorption collet is located at the end of the group of semiconductor chips in the circular shape, being held on the chuck 150 weakly, there occurs a case that no semiconductor chip lies at the position opposing to the absorption hole. Then, by closing the absorption hole with the close mechanism 78, it is possible to lessen the decrease in the absorption force of the absorption collet. Or, by actuating the close mechanism 78 for closing the absorption hole selectively, it is possible that a desired semiconductor chip will not be picked up from the chuck 150.

Also, with using an absorption collet 101e constructed with a large number of nozzles, the semiconductor chips can be mounted on the convey system 201 with an arbitrary pattern thereof.

Further, the separation station and the pickup station are provided separately, then it may take a time to pick up the semiconductor chips 10 from the chuck 150, therefore they can be connected to the mounting mechanism portion 300 directly, omitting the absorption collet portion 120 and the separation conveyer portion 200. Namely, it is possible to pick up each the semiconductor chip, independently, by the absorption nozzle 216 from the chuck 150 of the pickup station. In this case, there is a necessity of providing a mechanism for making a movement portion 210 move in two (2) axial directions of x andy, or a stage mechanism for making the support member 171 to support the chuck 150 move in two (2) axial directions of x and y.

Also, in case of connecting the mounting mechanism portion 300 to the separation mechanism portion 100 directly, with provision of the absorption nozzles 216 in plural, it is possible to improve the speed in mounting the semiconductor chips onto the tray 2 and/or the circuit board. Also, in a case of connecting the mounting mechanism portion 300 to the separation mechanism portion 100 directly, a reverse mechanism 208 may be provided between the chuck 150 and the mounting mechanism portion 300 in the pickup station, if there is a necessity of reversing the semiconductor chips. Further, in the trays 2, if using a tray 2 having absorption function therewith, it is also possible to reverse or turn over the group of semiconductor chips stored in the tray collectively, for example by reversing the one having the absorption function, so that they are received in the other.

Next, explanation will be given on an other embodiment, wherein the arrangement of the semiconductor chips are reversed on the chuck 150, and further the roll of the tray is also achieves therewith, by referring to FIGS. 22(a). In this embodiment, as shown in the FIG. 22(a), as a tape is applied a tape 192' having weak adhesiveness on the lower surface, for covering the group of semiconductor chips being stripped with the adhesive tape 50 therefrom. And, the starting end and the terminal end of this tape 192' are adhered (are pasted) again, for example by pushing on the frame 55 with a push roller 194', and as shown in the FIG. 22(b) is cut by a cutter 81 of the grind- or whetstone at the terminal end thereof, thereby adhering or sticking again all the group of semiconductor chips, which were absorbed on the chuck 150, upon the tape 192' which is pasted or attached on the frame 55 and has the weak adhesiveness therewith. The adhesion of the group of semiconductor chips absorbed on the chuck 150, again upon the tape 192' having the weak adhesiveness, can be achieved by moving the suppressing means 167 which is suppressed by the suppression mans 195. Further, the tape 192' covers the group of semiconductor chips being stripped with the adhesive tape 50 under the condition that it follows the strip angle fixing jig 165 suppressed by the suppression means 165, therefore it is also possible to prevent from being decreased in the absorption force on the chuck 150. However, in a case where the tape only cover them, though it may be sufficient if a length of the tape being enough to cover them is stored in the reel 191, while in a case of the tape 192' having the weak adhesiveness, there is a necessity that a considerable length of the tape must be stored in the reel 191 to be supplied, since it is cut at a predetermined length. A sending roller 80 is for the purpose of sending the tape 192' from the reel 191 to be fixed on the frame 55 at the starting end thereof. Next, as shown in the FIG. 22(c), by reversing the frame 55 grasped with the reverse mechanism (not shown in the figures), as indicated by an arrow, while weakening the absorption force by means of the chuck 150, the group of semiconductor chips adhered on the tape 192' which is pasted on the frame 55 and having the weak adhesiveness therewith come into a condition that they can be absorbed by the absorption collet 101 or the absorption nozzle 216, to be picked up. With this, the group of semiconducator chips can be reversed and absorbed by the absorption collet 101 or the absorption nozzle 216.

Also, carrying the arrangement of semiconductor chips, being adhered or stuck on the tape 192' which is pasted or attached on the frame 55 and has the weak adhesiveness therewith, the roll as the tray can also achieved thereby. If it is undesired to carry them under a condition as bear semiconductor chips, they may be stored in a container, such as the cassette, etc. And, the arrangement of semiconductor chips, being adhered or stuck on the tape 192' which is pasted or attached on the frame 55 and has the weak adhesiveness therewith, can be stored or packed in the container to be sold as products. For a user, it is possible to install the semiconductor chips on the circuit boards, etc., by picking it/them up in the mounting machine. Also, the arrangement of semiconductor chips, being adhered or stuck on the tape 192' which is pasted or attached on the frame 55 and has the weak adhesiveness therewith, can be set onto the mounting machine provided at other place, by carrying them with using the convey means, thereby to mount or install them on the circuit boards, etc., by picking up the semiconductor chips in the mounting machine.

Next, explanation will be given on another embodiment, wherein the arrangement of semiconductor chips on the chuck 150 also achieve the roll as the tray, by referring to FIG. 23. In this embodiment, as shown in the FIG. 23, on the surface of an upper surface of the chuck 150 is absorbed an adhesive sheet 86 having an adhesive layer 86a of weak adhesion force thereon. When carrying the adhesive sheet 86, it is preferable for it to be pasted on a metal frame 85, for example. However, an outer diameter of this metal frame 85 must be smaller than an inner diameter of the metal frame 55. In this manner, the adhesive sheet 86 is absorbed on the upper surface of the chuck 150 in advance and the work 60 is mounted thereon, thereby enabling to hold the each cut semiconductor chip with the weak adhesiveness of the adhesive sheet 86. Next, the adhesive sheet 50 is bent to be stripped or removed from the arrangement of semiconductor chips being held onto the adhesive tape 86 with the weak adhesiveness, by using the strip angle fixing jig 165 being suppressed by the suppression means 168. However, since the force holding the semiconductor chip by the adhesive sheet 86 is weak, it is necessary to make the suppressing means 167 suppressed by the suppression means 195 follow in the vicinity of the edge portion 165a of the strip angle fixing jig 165, as shown in the FIG. 7. Also, by using the method shown in the FIG. 15, if the force holding the semiconductor chip by the adhesive sheet 86 is weak, the adhesive sheet 50 can be stripped or removed from the arrangement of semiconductor chips. From the above, it is possible to obtain the arrangement of semiconductor chips being stripped with the adhesive sheet 50 thereof and being held on the adhesive sheet 86.

With this, first, since the force holding the semiconductor chip by the adhesive sheet 86 is weak, it is possible to pick them up under the condition as they are, being absorbed with the absorption collet 101 or the absorption nozzle 216.

Second, the arrangement of semiconductor chips are carried, being adhered or stuck on the adhesive sheet 86 which is pasted and/or attached on the frame 85 and has the weak adhesiveness, while weakening the absorption force of the chuck 150, thereby enabling to achieve the roll as the tray. If it is undesired to carry them under a condition as bear semiconductor chips, they may be stored in a container, such as the cassette, etc. And, the arrangement of semiconductor chips, being adhered or stuck on the sheet 86 which is pasted and/or attached on the frame 85 and has the weak adhesiveness therewith, can be stored or packed in the container to be sold as products. For a user, it is possible to install the semiconductor chips on the circuit boards, etc., by picking it/them up in the mounting machine. Also, the arrangement of semiconductor chips, being adhered or stuck on the sheet 86 which is pasted and/or attached on the frame 85 and has the weak adhesiveness therewith, can be set onto the mounting machine provided at other place, by carrying them with using the convey means, thereby to be installed or mounted on the circuit boards, etc., by picking up the semiconductor chips in the mounting machine.

Further, the explanation in the above was given on the embodiment(s), wherein the thin semiconductor wafer is cut out into a unit of the thin semiconductor element (semiconductor chip) under the condition of being stuck or adhered upon the adhesive sheet, the group of such the cut thin semiconductor elements are removed or separated from the adhesive sheet, and the group of the stripped semiconductor chips are conveyed by a unit predetermined thereof, sequentially, thereby each the semiconductor chip being packed in the tray or mounted on the board can be mounted (on the circuit board), sequentially, to be installed or mounted therein. However, it/they can be also applied to a case where, not only such the thin semiconductor wafer, but also, for example, semiconductor devices (electronic parts: each having a size of about 0.3 mm–20 mm, and a thickness being equal or less than 0.5 mm, for example, a thin material of such as quartz (being equal or less than about 0.3 mm–20 mm in the thickness), a fragile or breakable material or thing, a part of an information appliances, etc.) being connected in a large number thereof on a substrate or a tape, and are cut or separated by cutting the substrate or the tape connecting them, under the condition of being adhered or stuck on the adhesive sheet into a unit of the semiconductor devices (electronic parts), the group of such the cut semiconductor devices being stripped from the adhesive sheet, and the group of the stripped semiconductor devices are conveyed by a unit predetermined thereof, sequentially, thereby the each semiconductor device is packed in the tray or mounted on the board to be mounted (the circuit board), sequentially, to be installed or mounted therein. Namely, as in the condition of being stuck on the adhesive sheet, there may be considered various modes therefor.

In this manner, the electronic parts are separated into a unit thereof by cutting the substrate or the tape connecting therebetween under the condition of being stuck or adhered on the adhesive sheet, and the group of the cut electronic parts are removed from the adhesive sheet, collectively, under the condition of being held upon mount surfaces thereof by the chuck, therefore it is possible to supply the electronic parts to the mounting positions thereof, without reversing the parts but at high speed.

Next, explanation will be given on other embodiment of the separation mechanism portion (separation means) 100 mentioned in the above, by referring to FIGS. 31 to 38.

The FIG. 31 shows the group of the semiconductor chips 10 diagrammatically, being adhered or stuck on the adhesive sheet 50 which is pasted (mounted) on the metal frame 55, and being treated with the dicing. With respect to the group of semiconductor chips 10 being diced under the condition of the semiconductor wafer, as shown in the FIG. 31, an address called by "map" is assigned or designated to the separation mechanism portion (separation means) 100. Namely, that/those being surrounded by a thick frame(s)

indicates the condition that it/they is/are designated by the addresses, with respect to the group of the semiconductor chips 10 being diced into a predetermined shape, i.e., such as by x1, x2. . . along the x axis, y1, y2. . . along the y axis, standardizing upon a cross point between the x and y axes. In this situation, (x1, y1) and (x2, y2) indicate the chips on which test patterns are formed to be used when the semiconductors are tested, therefore they are made different from the chips to be used as the products ordinarily, in the surface conditions thereof.

Also, the address(es) being decided to be bad quality in a performance test (an operation test) under the condition of the wafer, so called the map(s) (the position coordinates of the bad quality pellet(s)), is/are stored into a recording medium (FD) or a memory device(s) of a testing apparatus, and is/are designated to be inputted into the controller (not shown in the figures) of the separation mechanism portion (separation means) 100, which is connected to the recording medium (FD) or the memory device(s) through a network.

The FIG. 32 is a view of showing a positioning mechanism 320 for abutting a standard surface 55a of the metal frame 55 on which is pasted or attached the adhesive sheet 50 adhering the group of the semiconductors 10 thereon, onto standard positioning pins 322a and 322b, thereby to positioning the group of the semiconductor chips 10. With provision of this positioning mechanism 320, for example, on the convey means 170 shown in the FIG. 16, it is possible to supply the works 60 to the separation station to be positioned and fixed therein.

The FIG. 33 is a view of showing a first embodiment, wherein under the principle of the separation mechanism portion (separation means) 100 shown in the FIG. 3, the outer appearance of the semiconductor chip being injured thereon is detected (recognized) before cutting off the adhesive sheet 50 from the metal frame (carrier ring) 55, and the defected semiconductor chip(s) is/are stopped being picked up in the pickup operation, thereby preventing from being mounted on the board to be mounted (a mounting board) or the tray 2. Namely, as shown in the FIGS. 32 and 33(a), by suppressing the metal frame 55 on which is pasted the adhesive sheet 50 adhering the group of the semiconductor chips 10 thereon, by means of a pusher 323, the standard end surface 55a of the metal frame 55 is abutted onto the standard positioning pins 322a and 322b provided on a standard plate 321, thereby positioning the group of the semiconductor chips 10. And, as shown in the FIG. 33(a), the position(s) of the semiconductor chip(s) on which occurs injury such as scratches, etc., in the group of the semiconductor chips, is/are detected by using the detector 330, standardizing upon the positioning mechanism 320, i.e., the chuck 150. As such the detector 330, there may be listed one of detecting the injury or the like optically, and other one of detecting it/them by ultrasonic waves. In case of detecting the outer appearance of the injury or the like, optically, without receiving a main reflection light (diffraction light of an order zero (0-th order)), the injury or the like may be detected, for example, from the continuity thereof (usually, the injury has the continuity therewith), upon the basis of the image signals obtained by receiving the scattering lights due to the injury or the like. In case of detecting the injury or the like by the ultrasonic waves, pulses of ultrasonic waves are irradiated upon the group of the semiconductor chips 10. The reflection waves reflected upon the injury or the like is detected on a Braun Tube, etc., if it lies on the semiconductor chip, thereby enabling to detec the outer appearance of the injury or the like.

Further, for detecting the position coordinates (address) of the defected chip(s) on which the injury occurs with standardizing on the positioning mechanism 320, the positioning mechanism 320 and the detector 330 must be moved relatively to each other, so as to make them travel on the group of the semiconductor chips 10.

From the above, in the process shown in the FIG. 33(a), the position coordinates (address) of the defected chip on which the injury occurs are detected and are memorized into the memory device of the controller (not shown in the figures) provided in the separation mechanism portion 100. Next, the work 60 is conveyed above the chuck 150 together with the positioning mechanism 320, and is located at the position shown in the FIG. 33(b). Thereafter, from the FIG. 33(b) to the FIG. 33(e), in the same manner as in the FIGS. 3(a) to (d), the adhesive tape 50 is stripped or removed from the group of the semiconductor chips 10 under the condition that the semiconductor chips 10 are absorbed on the chuck 150. And, as shown in the FIG. 33(d), the position coordinates (address) of the bad quality chip(s) and/or the defected chip(s) are memorized into the memory device of the controller, therefore only the good quality semiconductor chips can be picked up to be mounted on the tray 2 or on the board to be mounted, through the absorption collet 101, or directly by the tray 2.

The FIG. 34 is a view of showing a second embodiment, wherein under the principle of the separation mechanism portion (separation means) 100 shown in the FIG. 3, the adhesive agent is hardened just before cutting off the adhesive sheet 50 from the metal frame (carrier ring) 55, by irradiating UV rays or applying heat thereon, so that the semiconductor chip can be removed or separated from the adhesive sheet, easily. Namely, in the FIG. 2(c), by irradiating or applying the UV rays or heat onto the adhesive to harden before the work 60 is supplied into the separation station, the semiconductor chip can be removed from the adhesive sheet 50 easily, however as shown in the FIG. 34(a), the UV rays may be irradiated on or heat may be applied to harden the adhesive agent after the work 60 is supplied into the separation station, thereby to make the separation of the semiconductor chip from the adhesive sheet 50 ease. In case of this embodiment, the group of semiconductor chips are made to be removed from the adhesive sheet 50 easily after supplying the work 60 into the separation station, therefore it is possible to reduce a possibility that the semiconductor chip(s) may drop out or remove from the adhesive tape, during the convey or transfer of the work 60 under the condition of being attached on the metal frame. In the FIGS. 34(b) to (e), in the same manner as in the FIGS. 3(a) to (d), the group of the semiconductor chips 10 are removed from the adhesive tape (sheet) 50 under the condition of being absorbed on the chuck 150.

The FIG. 35 is a view of showing a third embodiment, wherein under the principle of the separation mechanism portion (separation means) 100 shown in the FIG. 3, the position coordinates of the group of semiconductor chips to be absorbed onto the chuck are detected (or recognized), standardizing upon the positioning mechanism 320 just before cutting off the adhesive sheet 50 from the metal frame (the carrier ring) 55, and the good quality semiconductor ship(s) is/are directly picked up upon the basis of the detected position coordinates of the group of semiconductor chips, thereby to be mounted on the board to be mounted or the tray 2. Namely, as shown in the FIG. 32 and the FIG. 35(a), the metal frame 55, on which is pasted the adhesive sheet 50 adhering or sticking the group of the semiconductor chips 10 thereon, is positioned by the positioning mechanism 320 provided on the convey means 170. And, as shown in the FIG. 35(a), such as like the bug patterns or the like, in the group of semiconductor chips being positioned by the positioning mechanism 320, the image(s) of the chip(s) (for example, being indicated by (x1, y1) and (x3, y3) in the FIG. 31), each having a factor(s) being different from that of the semiconductor chip satisfying the original or inherent design specification in the outer appearance or the inner performance(s) thereof (such as the patterns or the like), is/are picked up by the image pickup means 351, such as a TV camera provided on an X-Y-Θ stage 350, thereby detecting the position coordinates thereof with respect to the group of semiconductor chips. Next, as shown in the FIG. 35(*b*), under the condition of being positioned by the positioning mechanism 320, the group of semiconductor chips are absorbed on the chuck 150. Namely, a relative relationship in the position between the coordinate system, which is picked up by the image pickup means 351 and is given with the positioning mechanism 32, and the chuck 150 is determined. In short, the coordinate system (i.e., the address(es)) picked up by the image pickup means 351 is detected by standardizing upon the chuck 150. Accordingly, in the process of picking up shown in the FIG. 35(*g*), it is possible to pick up the good quality semiconductor chip(s) from the chuck 150, directly by means of the absorption collet 101, or directly by the absorption nozzle 216, to be mounted on the board to be mounted (i.e., the mounting board) or on the tray 2, on the basis of the coordinate system (i.e., the address(es)) which is picked up by the image pickup means 351 through the controller, even under the condition that the bad quality chip(s) and/or the broken piece(s) or end(s) thereof are remained thereon. With this method, the position never differ from the map position recorded on the recording medium, such as the FD, etc. Also, it is possible to make correspondence to the data for dividing the good quality semiconductor chips on the performances thereof, which is maintained in the recording medium, such as the FD, etc. Further, the FIGS. 35(*c*) to 35(*f*) are same to those shown in the FIGS. 3(*a*) to (*d*).

In the FIG. 36, there is shown a fourth embodiment, which comprises every aspects of the embodiments shown in the FIGS. 33 to 35. Namely, what is shown in the FIG. 36(*a*) is same to the process shown in the FIG. 33(*a*). what is shown in the FIG. 36(*b*) is same to the process shown in the FIG. 34(*a*). What is shown in the FIGS. 36(*c*) and (*d*) is same to the process shown in the FIGS. 35(*a*) and (*b*). What is shown in the FIGS. 36(*e*) to (*d*) is same to the process shown in the FIGS. 3(*a*) to (*d*). What is shown in the FIG. 36(*i*) is same to the process shown in the FIG. 33(*f*) and the FIG. 35(*g*).

The FIG. 37 shows an embodiment of the removal means for removing dusts, such as the bad quality chip(s) and/or the broken piece(s) or end(s) remained on the chuck. Namely, moving a conductive brush 371 for protecting from static electricity or a rotating body attached with such the conductive brush 371, the dusts 372, including such as the bad quality chip(s) and the broken piece(s) or end(s) remained on the chuck are taken away therefrom to be collected into a discharge container 373. Further, closing a vacuum suction valve 374 while closing a valve 375, an air for preventing from the static electricity (for example, an ion blow) 374 may be supplied to be discharged from the chucking surface, thereby bringing the dusts 372, such as the bad quality chip(s) and the broken piece(s) or end(s) remained on the chuck to be taken away or brushed easily. By doing so, it is possible to absorb a new group of semiconductor chips on the chucking surface of the chuck 150, without trouble therewith.

Also, a case can be considered that the dusts, such as broken pieces, etc., are adhered or stuck on the adhesive tape or sheet 50 when the adhesive tape or sheet 50 falls down or removed from the group of semiconductor chips absorbed on the chuck 150. In such the occasion, it is impossible to abolish the adhesive tape or sheet 50 as it is, but it must be abolished after removing the dusts attached, such as broken pieces or ends and foreign substances, therefrom. Then, as shown in the FIG. 38, the dusts, such as broken pieces or ends and foreign substances 383 which are stuck onto the adhesive tape or sheet 50, are brushed off by means of a blade-like brush 382 which is attached at the tip of a suction opening 381, while applying heat or lights upon the adhesive tape or sheet 50 which is stripped, for example, by the strip angle fixing jig 165, so as to be stripped easily, and then are sucked by the suction opening 381. Thereby, the dusts, such as broken pieces or ends and foreign substances can be removed from the adhesive tape or sheet 50 to be collected therefrom. Of course, the suction opening 381 must be moved in synchronism with the movement of the strip angle fixing jig 165.

Next, explanation will be given on an example of the structure of an IC card, in which the above-mentioned semiconductor chip(s) is/are mounted on a circuit board to construct a thin electronic circuit part(s), and the manufacturing method of the IC card.

First, explanation will be given on the structure of the IC card, by referring to FIGS. 24 to 26. The FIG. 24 is a plane view of the IC card, the FIG. 25 an A-B-C-D cross-section view in the FIG. 24, and FIG. 26 an enlarged cross-section view of the principle portion in the FIG. 25.

As shown in the FIG. 24, the IC card 400 comprises a film 410, a conductor pattern 420 formed on the film 410, and an electronic part 430 (10), such as an IC chip connected to the of conductor pattern 420 through a connecting terminal 432. A portion of the conductor pattern 420 constructs a loop-like antenna coil 422, and the antenna coil 422 is connected to the electronic part 430 (10) through the conductor pattern. It is assumed that the number of turn of the antenna coil 422 is an arbitrary turn number. Also, the electronic part 430 is fixed with respect to the film 410.

The width D1 of the IC card 400 is 54 mm, and the length L1 thereof 85.6 mm, for example, then it has a size being same to a so-called a credit card and/or a telephone card. The electronic part 430 (10) in a square shape, having a width D2 of 3 mm, for example, is used therein. The width D3 of the antenna coil 422 and the width D4 of the conductor pattern 420 are 0.2 mm, for each, for example. The connector terminal 432 is narrower than that of the conductor pattern 420, for example, being 0.15 mm in shape of a cubic.

Next, the cross-section structure of the IC card will be explained by referring to the FIG. 25. Namely, on the film 410 of the IC card 400 are formed the conductor pattern 420 and the antenna coil 422 by printing thereof. On the film 410 is fixed the electronic part 430 (10), such as the IC chip or the like, through a liquid 440 for provisional fixation, and the connector terminal 432 of the electronic part 430 is directly connected to the conductor pattern 420, thereby conducting them electrically. The film 430 is laminated together with a cover film 460 to be fixed therewith, by using a glue 450, such as a hot melt, under the condition of putting the conductor pattern 420 and the electronic part 430 inside between them. And, upon the film 410 and the cover film 460, printing surfaces 470 and 472 for printing design patterns thereon are formed by a printing process.

With the construction of the above, the thickness H of the IC card 400 is about 0.25 mm, thereby realizing the thin-sizing thereof.

Features of the construction of such the IC card 400 lie in the following aspects. Namely, the forming of the conductor patterns 420 and 422 of the conductor paste, such as Ag, Cu, etc., brings the IC card into a simplified construction thereof. According to the method which is tried recently, comparing to that in which the conductor pattern, in particular, the antenna coil is formed on both surfaces of the film, a screen printing process for forming the conductor pattern on one side surface and a dry process thereafter can be omitted, thereby reducing down the number of the processes therefor. Also, the IC card is simplified in the construction thereof, thereby it can be thinned, such as about 0.25 mm, in the thickness thereof.

Next, a manufacturing method of the IC card will be explained by referring to the FIG. 27.

The manufacturing method of the IC card comprises: a printing process P10 for forming the conductor pattern 420 and the antenna coil 422 on the film 410, through printing by means of a screen print method or technology, for example, with using the conductor paste of Ag, Cu, etc.; a dry process P20 for drying the formed conductor pattern 420 and the antenna coil 422 through instantaneous evaporation of solvent contained in the conductor paste, by scanning a laser beam in a line-like manner thereupon while moving the conductor pattern 420 and the antenna coil 422 together with the film 410 mentioned above; a process P30 for printing or applying a bonding or adhesive agent 440 for provisional fixation thereon, at the positions where the electronic element(s) 430 (10) is/are to be mounted, with using a dispenser, etc.; a mounting process P40 for mounting the electronic element(s) 430 (10) as was mentioned previously; a process P50 for achieving a laminate process, with heating/suppressing and simultaneous connection of the electronic parts of the IC card; a cutting process P60 for cutting out the sheet being laminated in the said process P50 into a size of each the IC card; a process P70 for printing the design patterns 470 and 472 on both surfaces thereof; a testing process P80 for conducting the test on the electronic parts about read/write (R/W) operation thereof; and a process P90 for cutting off the outer configuration thereof.

Here, as the material of the film 410 may be used a transparent or a white colored plastic material, such as PET (polyethylene terephthalate), PVC (polyvinyl chloride), plyimide, or the like, having the thickness being about 75 $\mu$m to 100 $\mu$m, for example. Further, the film is supplied to the manufacturing apparatus of the IC card under a condition of roll having the width of 250 mm, for example.

The printing process P10 is a process for forming a large number of the conductor patterns 420 and the antenna coils 422 on a longitudinal direction of the film 410, corresponding to a large number of the IC cards, printing by means of the screen print method or technology, for example, with using the conductor paste such as Ag, Cu, etc.

The next dry process P20 is a process for heating only the conductor paste of such as Ag or the like to dry up, by using a YAG laser having wavelength of 1.06 $\mu$m as the laser light to be applied, since an absorption band lies within a range of the wavelength 9 $\mu$m to 10 $\mu$m, in particular, in a case of the transparent PET film.

In this manner, energy beam of the laser beam or a beam of charged particles or the like is irradiated upon the printed conductor patter 420 and the antenna coil 422 with scanning on them in the line-like manner while moving the conductor patter 420 and the antenna coil 422 together with the film 410, thereby enabling to dry up in a short time (i.e., within one (1) minute) the conductor patter 420 and the antenna coil 422 which are arranged in a large number thereof.

The next process P30 is a process for printing or applying the bonding or adhesive agent 440 for provisional fixation, at the positions where the electronic elements 430 (10) are to be mounted, with using a dispenser, etc., in an area being same to the size of the electronic part or a little bit larger than that. As a material of the bonding agent 440 for provisional fixation is utilized a thermal plastic hot melt, which is soften in a range from 100° C. to 130° C. Also, in the place of the hot melt, it is also possible to use a UV curable resin or the like.

The nest mounting process P40 is a process, wherein the end 432 of the electronic part 430 (10), such as the semiconductor chip which is separated and absorbed onto the absorption nozzle 216 to be conveyed, as was mentioned previously, is positioned corresponding to a predetermined terminal portion of the conductor pattern 420 upon a film-like circuit board (film circuit board) as the board 30 to be mounted, which is mounted on the XY stage 302 and 303, thereby mounting the above-mentioned electronic parts 430 on the conductor patterns 420. Since on the film circuit board 410 is applied the bonding or adhesive agent 440 for provisional fixation in the process P30, the electronic parts 430 are fixed on the film circuit board 410 thereby. Further, the connection terminals 432 of the electronic part 430 are formed by a ball bonding method or technology, and an insulation process is treated on the portion other than that by polyimide, for example.

Next, explanation will be given on the process P50 for conducting the laminate process with applying the heating/suppressing and the simultaneous connection of the electronic parts, by referring to the FIGS. 28 and 29. In the FIG. 28, the cover film 460 is used, which is made of the same material and has the same thickness as the film 410. Namely, as the cover film 460 is used the transparent or white-colored PET, which has the thickness of about 75 $\mu$m–100 $\mu$m. Upon one surface of the cover film 460, a glue 450 is applied or laminated in advance, at the thickness of 80 $\mu$m, for example. Here, as a material of the glue 450 may be utilized a hot melt. It may be also possible to use an adhesive agent other than the hot melt.

The process P50 is a process, wherein the film 410 on which the electronic part 430 (10) is mounted and the cover film 460 on which the glue 450 is laminated are introduced between hot rolls 481 and 482, thereby to laminate the film 410 and the cover film 460 together by means of the hot rolls 481 and 482. For the hot rolls 481 and 482 are used a roll made of steel, thereby performing the laminate, and the leveling thereof as well, at the same time.

In this instance, as shown in the FIG. 28, the terminal 432 of the electronic part 430 bits onto the conductor pattern 420 with excluding the bonding or adhesive agent 440 for provisional fixation at the same time, thereby connecting those conductors electrically to each other. Here, a laminating pressure is set at about 20 kgf/cm$^2$ and heating energy at 130° C., thereby enabling to achieve the lamination between the film 410 and the cover film 460, and the connection between the terminal 432 of the electronic part 430 and the conductor pattern 420, at the same time.

Further, with using the bonding or adhesive agent 440 for provisional fixation, such as the hot melt, for the purpose of fixing the electronic parts 430 thereon provisionally, comparing to a case of using an aerotropic conductive adhesive agent, for example, there can be obtained advantages that the material is cheap in the cost thereof, that the connection of the electronic parts can be achieved in a short time, and that a high requirement should not made on accuracy in mounting of the electronic parts. Further, the lamination can be performed with using a flat press other than such the method of using the hot rolls.

Next, the laminated sheet is cut out into each IC card having the size thereof, in the cutting process P60, and then the design patterns 470 and 472 are printed on both surfaces thereof, in the process P70. In the test process P80, electricity is transmitted to the antenna 422 through radio wave by means of a communication test apparatus, so as to make the electronic parts, etc., send and receive data through the radio wave, thereby conducting the test on reading/writing (R/W). And, the outer configuration is cut off in the process P90, and then the IC card 400 is completed.

In the embodiment mentioned above, the explanation was given on the case where the conductor paste is printed by the screen printing to form the conductor patterns 420 and 422, however they may be formed by etching or wires. In this instance, on the conductor pattern 420 is formed a layer, in advance, such as of low melting point solder of Sn/Bi group (melting point: 100° C.–150° C.) or In alloy of low melting point. On the other hand, with treating Au solder on the surface of the connection terminal 432 of the electronic part 430, which is formed by means of a ball bonding, it is possible to keep the condition of bonding or connection between the connection terminal 432 and the conductor pattern 420 in the heating/suppressing process P50. Of course, there is no necessity of treating Au solder when the ball bonding is treated with such Au.

As is mentioned in the above, the thin type IC card 400 can be manufactured with high efficiency and with cheap.

Also as was mentioned previously, the explanation was made on the embodiment, wherein the adhesive tape or sheet on which the semiconductor wafer is boned or adhered is attached on the metal frame, thereafter being diced into groups of semiconductor chips, and the semiconductor ships are absorbed on the chuck to be stripped with the adhesive tape or sheet therefrom, thereby to be picked up, however the present invention can be also applied to a case where the adhesive tape or sheet is adhered as a BG (background) tape onto a semiconductor wafer for treating processes thereupon, and the adhesive tape as the BG tape is stripped therefrom at the time point when the processes are completed.

According to the present invention, there can be obtained an effect that the thin semiconductor wafer about from 0.002 to 0.2 mm in the thickness thereof is cut into a unit of the thin semiconductor element (semiconductor chip) under the condition of being stuck on the adhesive sheet or tape, and the group of the cut semiconductor elements are removed from the adhesive sheet or tape to be divided, without injuring or breaking of each the semiconductor element at high speed.

According to the present invention, there also can be obtained an effect that the thin semiconductor wafer about from 0.002 mm to 0.2 mm in the thickness thereof is cut out into a unit of the thin semiconductor element (semiconductor chip) under the condition of being stuck on the adhesive sheet or tape, and the group of the cut semiconductor elements are removed from the adhesive sheet or tape to be divided, without injuring or breaking of each the semiconductor element at high speed, thereby obtaining the semiconductor chips in a condition of being packed in the tray to be carried or in the condition being similar thereto.

Further, according to the present invention, there also can be obtained an effect that the thin semiconductor wafer about from 0.002 to 0.2 mm in the thickness thereof is cut into a unit of the thin semiconductor element (semiconductor chip) under the condition of being stuck on the adhesive sheet or tape, and the group of the cut semiconductor elements are removed from the adhesive sheet or tape, without injuring or breaking of each the semiconductor element at high speed, thereby conveying the group of stripped semiconductor elements in sequence by a predetermined unit thereof, so to mount each of the semiconductor elements in sequence on the tray or the board to be mounted (the circuit board).

Also, according to the present invention, there can be obtained a further effect that the thin type of IC card of high quality can be manufactured with high efficiency, cheaply.

What is claimed is:

1. A separating method of semiconductor elements comprising:

a separation step for holding on a chuck a group of semiconductor elements as an object, being stuck on an adhesive sheet under condition of semiconductor wafer and cut out into a unit of the semiconductor element under the condition of a semiconductor wafer, and striping said adhesive sheet from the group of semiconductor elements under the condition of a semiconductor wafer; and a storing step into a tray, for picking up the semiconductor elements by a desired unit thereof from the group of semiconductor elements being stripped with the adhesive sheet therefrom in said stripping step and being held on the chuck, so as to be stored into a tray.

2. A separating method of semiconductor elements comprising:

a separation step for holding on a chuck a group of semiconductor elements, by positioning an object being stuck on an adhesive sheet which is fixed on a frame at periphery thereof, under condition of a semiconductor wafer and being cut into a unit of a semiconductor element under the condition of a semiconductor wafer, for cutting the adhesive sheet around the group of semiconductor elements being held, and for striping the cut adhesive sheet from said group of semiconductor elements being held under the condition of a semiconductor wafer; and a storing step for storing into a tray, for picking up the semiconductor elements by a desired unit thereof from the group of semiconductor elements being stripped with the adhesive sheet in said separation step and held on the chuck, so as to be stored into a tray.

3. A separating method of semiconductor elements comprising:

a separation step for holding on a chuck a group of semiconductor elements as an object, being stuck on an adhesive sheet under condition of a semiconductor wafer and cut out into a unit of the semiconductor element under the condition of a semiconductor wafer, and for striping said adhesive sheet from the group of semiconductor elements under the condition of a semiconductor wafer; and a pickup step for picking up the semiconductor element independently from the group of semiconductor elements being stripped with the adhesive sheet therefrom in said separating step and being held on the chuck.

4. A separating method of semiconductor elements comprising:

a separation step for holding on a chuck a group of semiconductor elements, by positioning an object being stuck on an adhesive sheet which is fixed on a frame at periphery thereof, under condition of a semiconductor wafer and being cut out into a unit of a semiconductor element under the condition of a semiconductor wafer, for cutting the adhesive sheet around the group of semiconductor elements being held, and for striping the cut adhesive sheet from said group of semiconductor elements being held under the condition of a semiconductor wafer; and a pickup step of picking up the semiconductor element independently from the group of semiconductor elements being stripped with the adhesive sheet therefrom in said separating step and being held on the chuck.

5. A separating method of semiconductor elements defined in the claim 3 or 4, wherein said separation step and said pickup step are conducted in parallel to each other.

6. A separating method of semiconductor elements, comprising the following steps:

holding a group of semiconductor elements, being adhered onto a sheet for use of provisional fixation thereof, which is held on a chuck and has adhesiveness, by positioning an object, being stuck on an adhesive sheet which is fixed on a frame at periphery thereof under condition of a semiconductor wafer, and cut out into a unit of the semiconductor element under the condition of a semiconductor wafer;

cutting the adhesive sheet around the semiconductor elements being held; and stripping the adhesive sheet cut from the group of semiconductor elements under the condition of a semiconductor wafer, thereby obtaining the group of semiconductor elements, each semiconductor element being adhered onto the sheet for use of provisional fixation thereof, so as to be picked up.

7. A separating method of semiconductor elements, comprising the following steps:

holding a group of semiconductor elements onto a chuck by positioning an object, being stuck on an adhesive sheet which is fixed on a frame at periphery thereof under condition of a semiconductor wafer and cut out into a unit of the semiconductor element under the condition of a semiconductor wafer;

cutting the adhesive sheet around the semiconductor elements being held under the condition of a semiconductor wafer; and adhering a sheet having adhesiveness for use of provisional fixation to the group of semiconductor elements on a side upon which said adhesive sheet is adhered so that each the semiconductor element can be picked up, while stripping the cut adhesive sheet cut from said group of semiconductor elements being held.

* * * * *